(12) United States Patent
Komai

(10) Patent No.: US 8,374,041 B2
(45) Date of Patent: Feb. 12, 2013

(54) TRANSFER CIRCUIT, NONVOLATILE SEMICONDUCTOR DEVICE USING THE SAME, AND TRANSFER METHOD OF THE SAME

(75) Inventor: Hiromitsu Komai, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 140 days.

(21) Appl. No.: 13/039,734

(22) Filed: Mar. 3, 2011

(65) Prior Publication Data

US 2011/0222349 A1   Sep. 15, 2011

(30) Foreign Application Priority Data

Mar. 10, 2010  (JP) ................................. 2010-053598

(51) Int. Cl.
*G11C 7/10* (2006.01)
*G11C 7/00* (2006.01)
(52) U.S. Cl. ........ 365/189.17; 365/189.011; 365/189.05
(58) Field of Classification Search .............. 365/189.17
See application file for complete search history.

(56) References Cited

U.S. PATENT DOCUMENTS

| | | | | |
|---|---|---|---|---|
| 5,764,584 | A * | 6/1998 | Fukiage et al. | 365/230.03 |
| 6,055,210 | A * | 4/2000 | Setogawa | 365/233.12 |
| 6,377,497 | B2 * | 4/2002 | Sato | 365/196 |
| 6,639,845 | B2 * | 10/2003 | Fujii et al. | 365/189.05 |
| 6,879,520 | B2 * | 4/2005 | Hosono et al. | 365/185.17 |
| 7,236,424 | B2 * | 6/2007 | Tokiwa | 365/233.12 |

FOREIGN PATENT DOCUMENTS

| | | |
|---|---|---|
| JP | 63-209094 | 8/1988 |
| JP | 9-274527 | 10/1997 |
| JP | 2001-325796 | 11/2001 |
| JP | 2002-324400 | 11/2002 |
| JP | 2003-249082 | 9/2003 |
| JP | 2005-285283 | 10/2005 |
| JP | 2008-535139 | 8/2008 |
| JP | 2009-044276 | 2/2009 |
| JP | 2009-054246 | 3/2009 |
| JP | 2009-064530 | 3/2009 |
| JP | 2009-076116 | 4/2009 |
| JP | 2009-158061 | 7/2009 |
| JP | 2009-277348 | 11/2009 |

OTHER PUBLICATIONS

Japanese Office Action mailed on Jul. 25, 2012, issued for Japanese Application No. 2010-053598 (with English Translation).

* cited by examiner

*Primary Examiner* — Son Mai
(74) *Attorney, Agent, or Firm* — Oblon, Spivak, McClelland, Maier & Neustadt, L.L.P.

(57) ABSTRACT

According to one embodiment, a transfer circuit includes a first inverter, a second inverter, a first line, a second line, a first holder, and a second holder. The first inverter inverts data at a first node and transfers the inverted data to a second node. The second inverter inverts the data at the second node and transfers the inverted data to the first node. The first line connected to the first node. The second line connected to the second node. The first holder may output data to the first node. The second holder may output data to the second node. When the first holder outputs the data to the first line, the first and second inverters are turned off. When the second holder outputs the data to the first line through the second node, the first inverter is turned off.

19 Claims, 19 Drawing Sheets

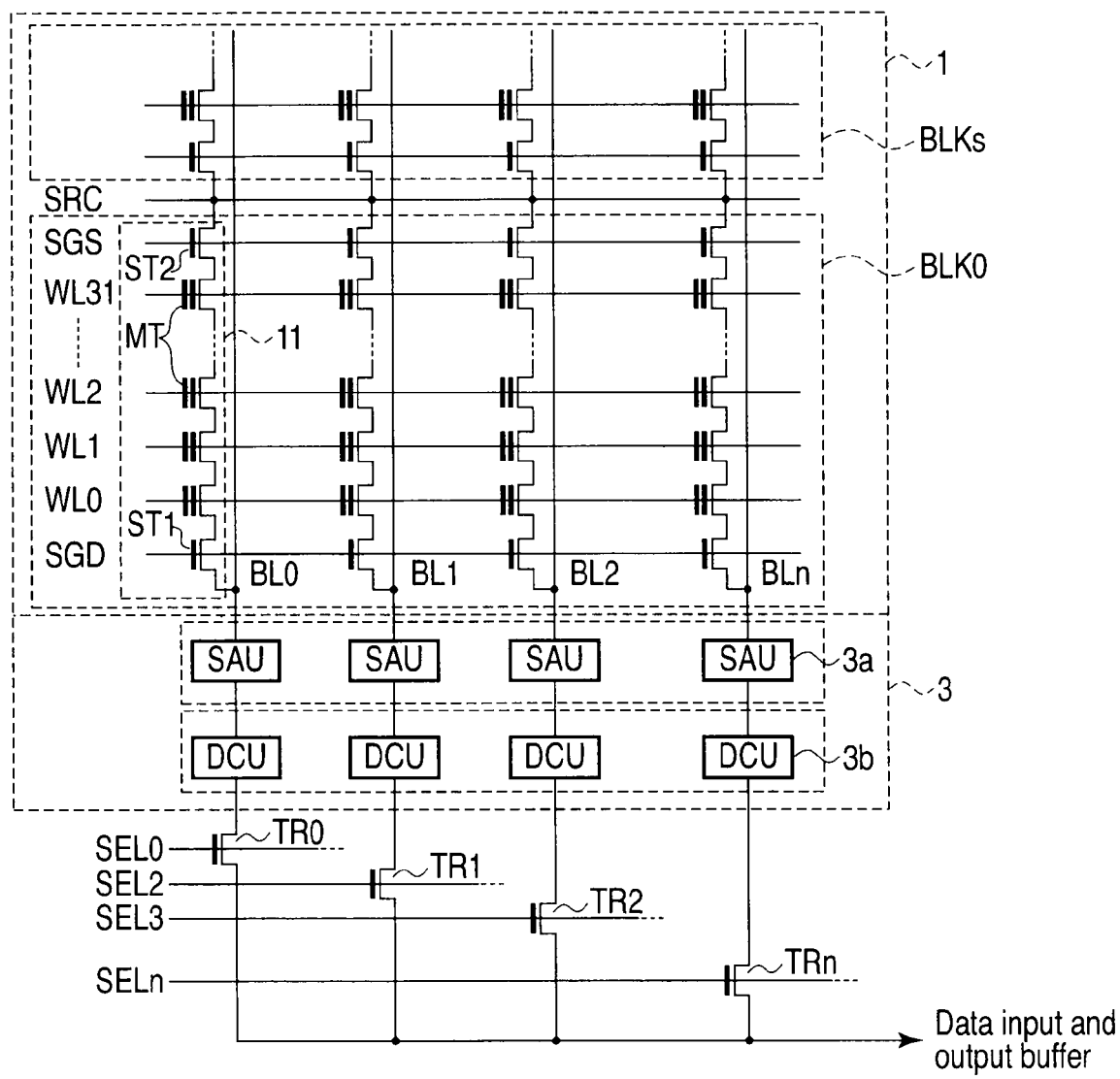
F I G. 2

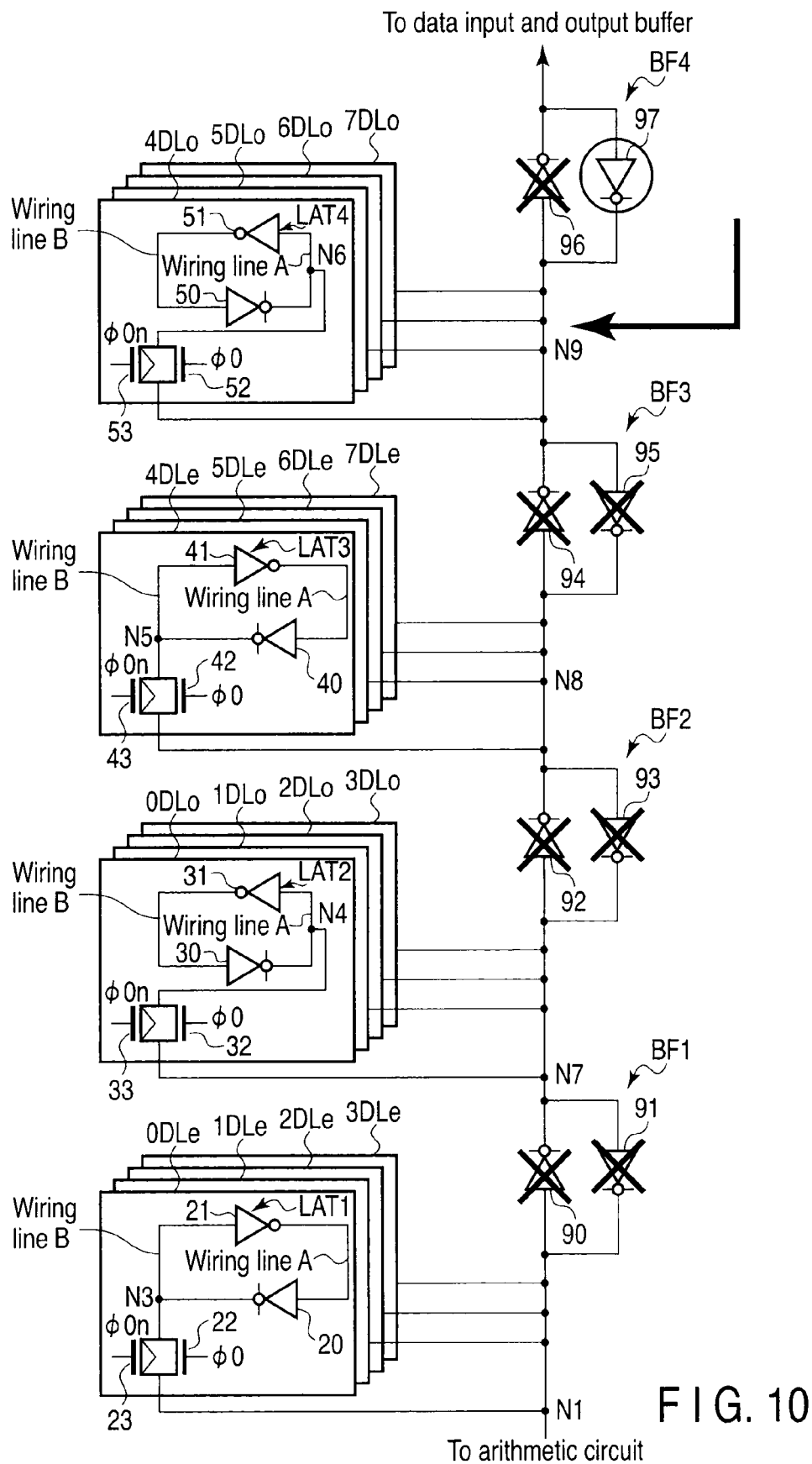
F I G. 10

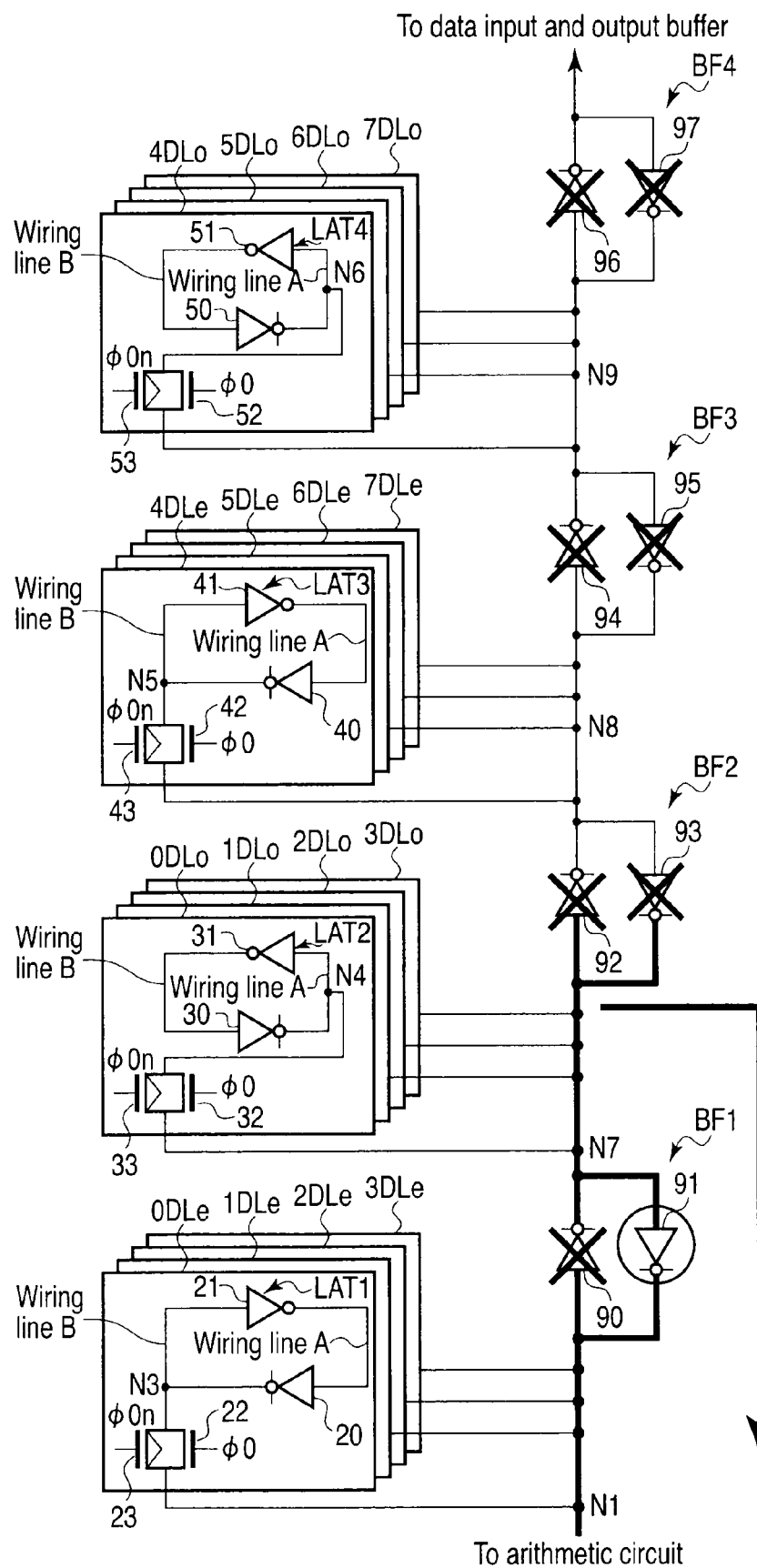
F I G. 12

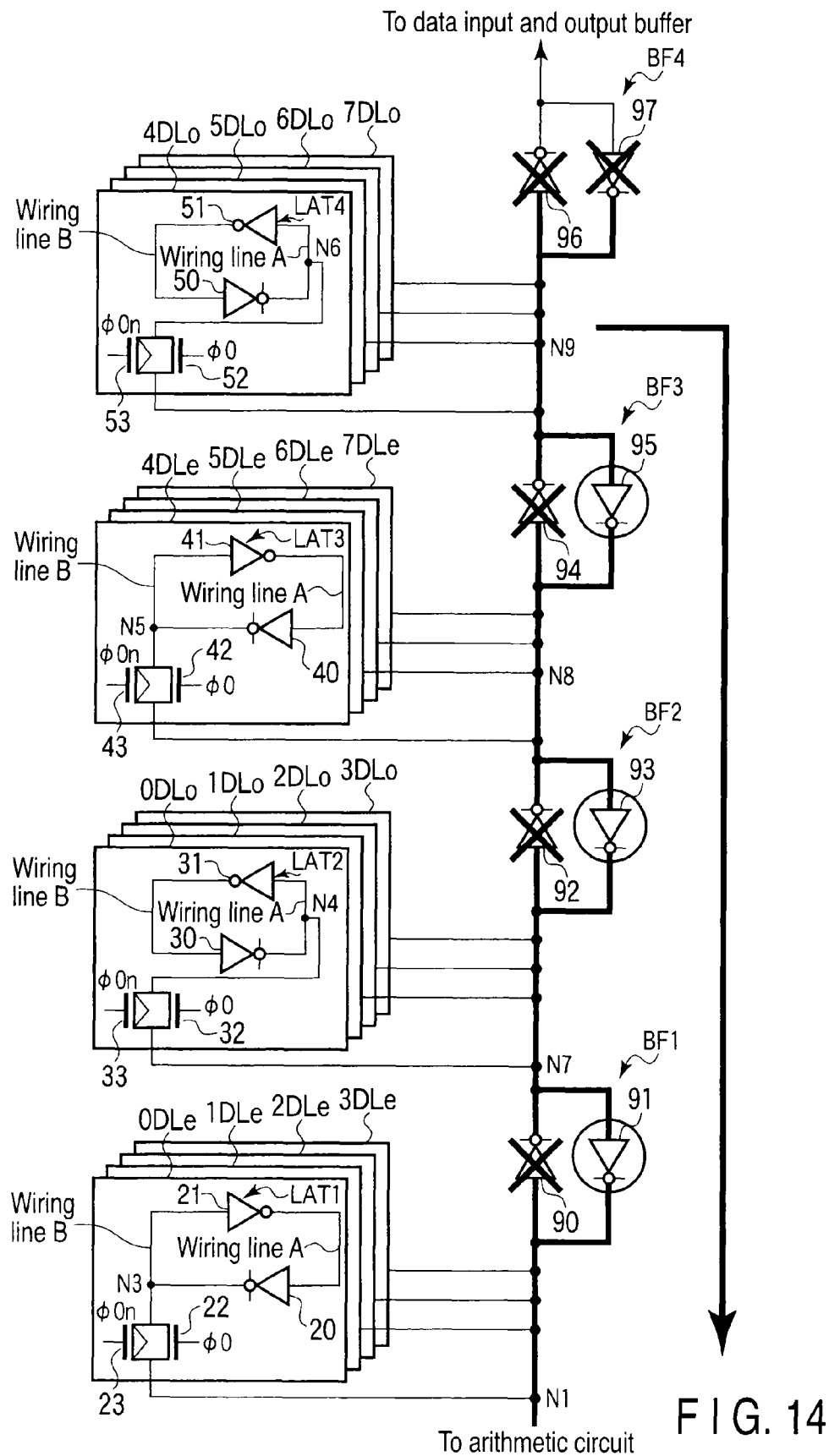
F I G. 14

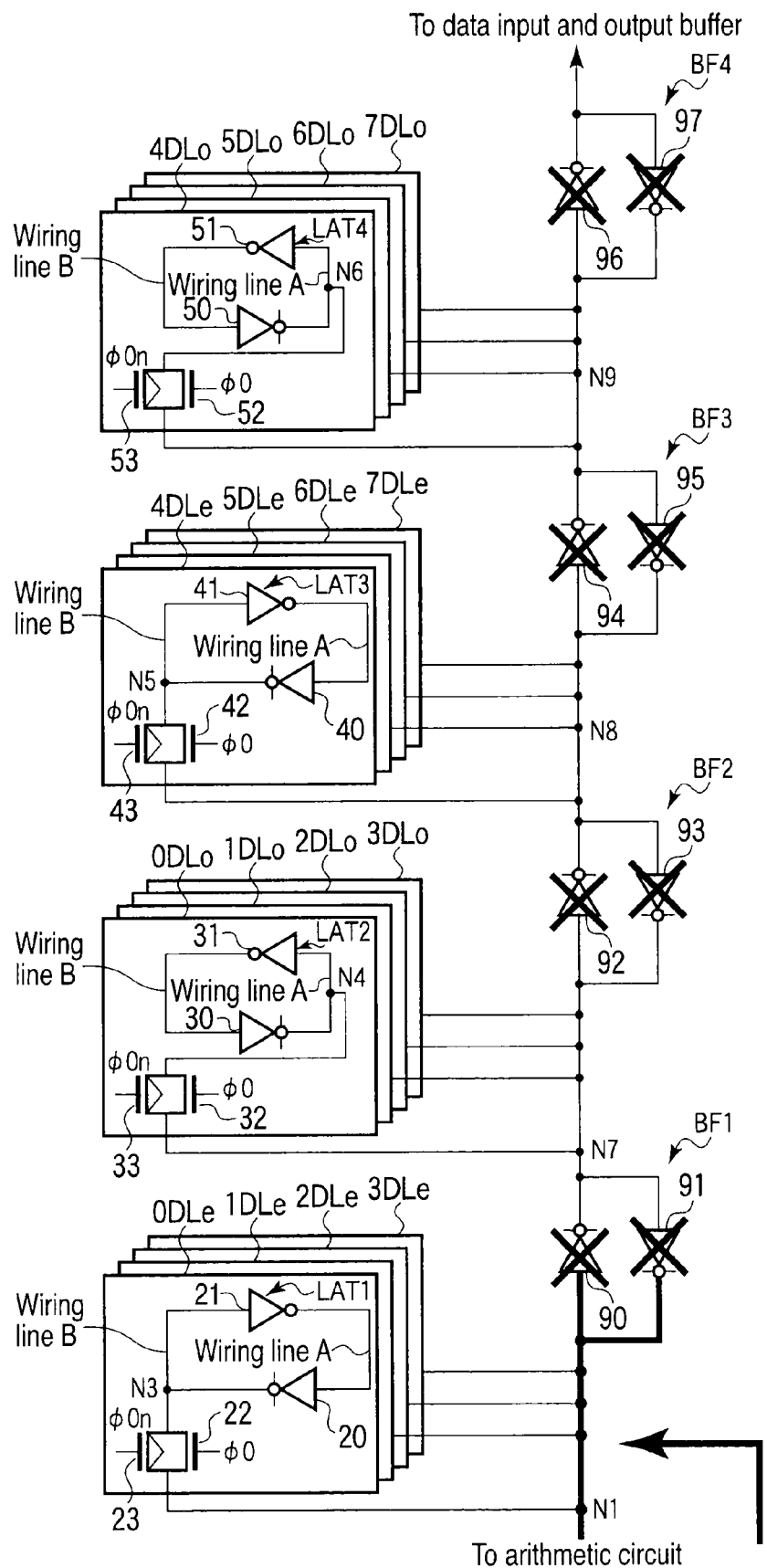
F I G. 15

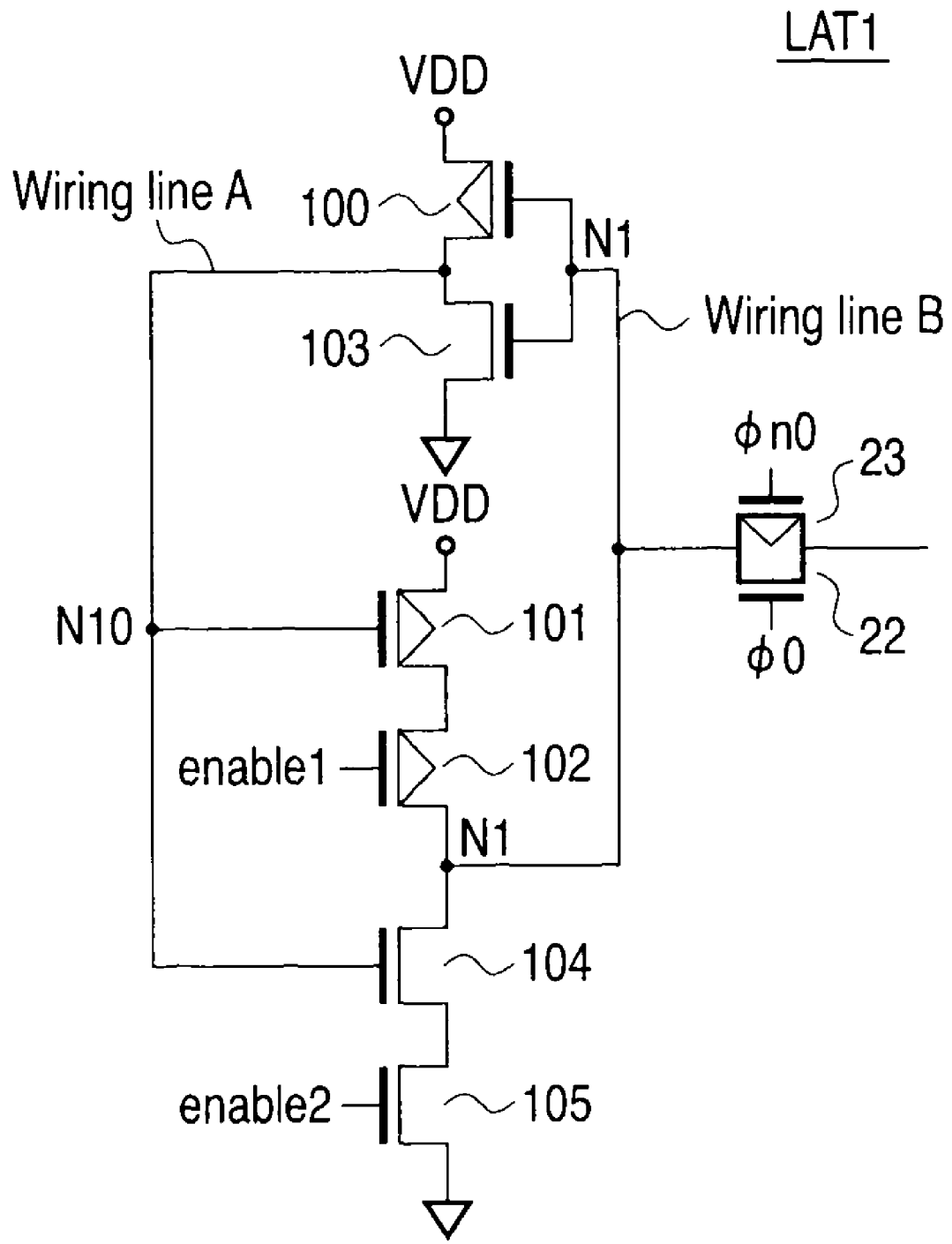
F I G. 19

US 8,374,041 B2

TRANSFER CIRCUIT, NONVOLATILE SEMICONDUCTOR DEVICE USING THE SAME, AND TRANSFER METHOD OF THE SAME

CROSS-REFERENCE TO RELATED APPLICATIONS

This application is based upon and claims the benefit of priority from Japanese Patent Application No. 2010-053598, filed Mar. 10, 2010; the entire contents of which are incorporated herein by reference.

FIELD

Embodiments described herein relate generally to a transfer circuit and a nonvolatile semiconductor device using the transfer circuit.

BACKGROUND

In a NAND flash memory, a data latch circuit that holds data transferred from a host or from memory cell transistors is connected to a sense amplifier by a common data bus with a large wiring line capacitance. The data latch circuit includes a switching element and two inverters. The two inverters employ a configuration in which the output terminals of the respective inverters are connected to the input terminals of the others, respectively, which is described in Jpn. Pat. Appln. KOKAI Publication No. 09-274527. Data held in the data latch circuit has a value corresponding to the potential of a wiring line connecting the inverters.

In writing, data is transferred from the data latch circuit to memory cell transistors through the sense amplifier. In reading, the sense amplifier reads data held in memory cell transistors and transfers the data to the data latch circuit.

BRIEF DESCRIPTION OF THE DRAWINGS

FIG. 2 is a block diagram of a memory cell array and a sense amplifier according to the embodiment;

FIGS. 7 to 10 are conceptual diagrams showing write operations to the data latch circuit according to the embodiment;

FIGS. 11 to 14 are conceptual diagrams showing write operations to an arithmetic circuit according to the embodiment;

FIGS. 15 to 18 are conceptual diagrams showing read operations into the data latch circuit according to the embodiment;

FIG. 19 is a circuit diagram of a data latch according to the embodiment; and

DETAILED DESCRIPTION

Figure 1:
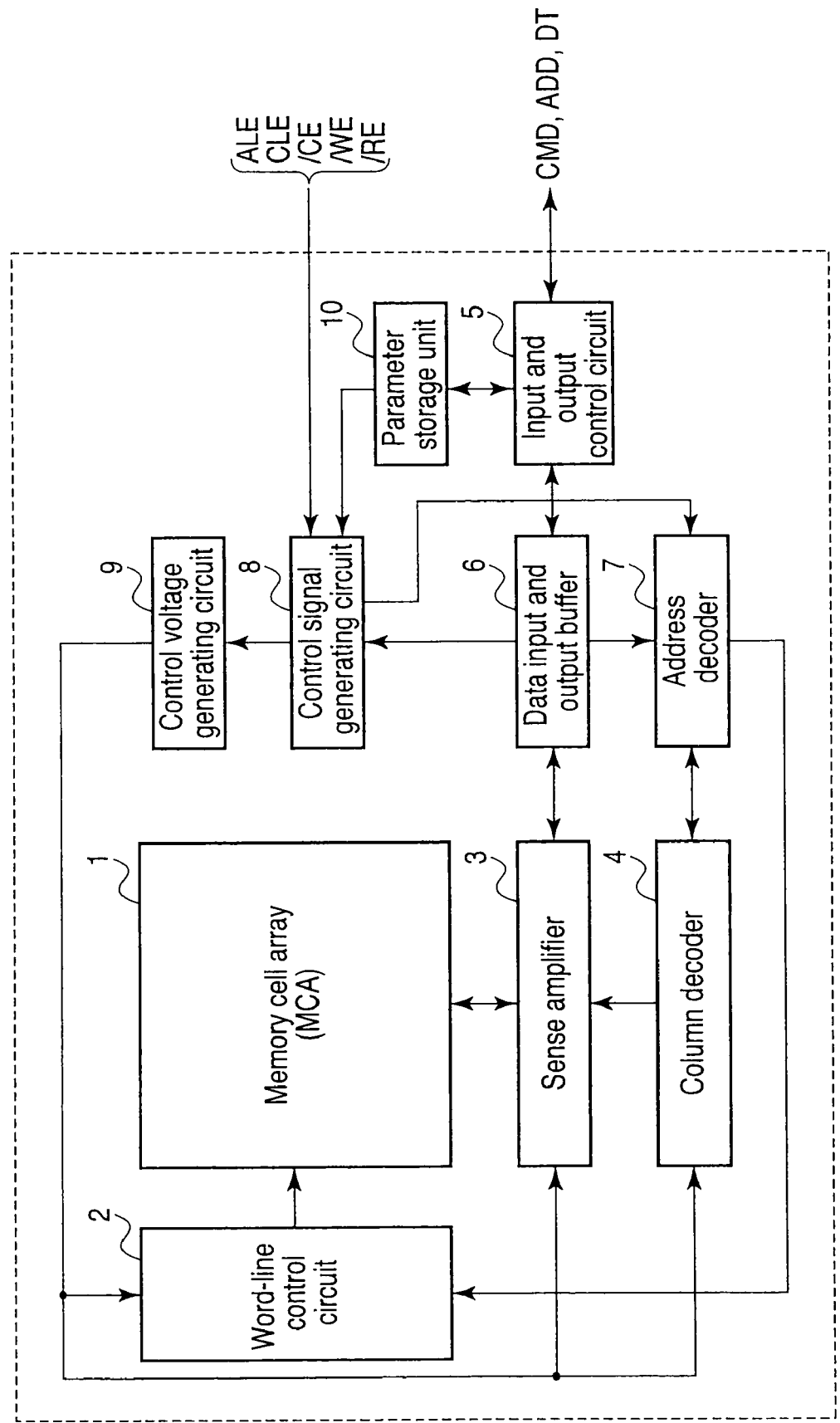
FIG. 1 is a block diagram of a NAND flash memory according to an embodiment.

An embodiment will be described below with reference to the drawings. In the description, common parts are denoted by common reference numerals throughout the drawings.

In general, according to one embodiment, a transfer circuit includes a first inverter, a second inverter, a first signal line, a second signal line, a first holding circuit, and a second holding circuit. The first inverter is provided with a function of turning on or off state and inverts, when on state, data at a first node and transfers the inverted data to a second node. The second inverter is provided with a function of turning on or off state and inverts, when on state, the data at the second node and transfers the inverted data to the first node. The first signal line connected to the first node. The second signal line connected to the second node. The first holding circuit may output data to the first node and may hold data at the first node. The second holding circuit may output data to the second node and may hold data at the second node. When the first holding circuit outputs the data to the first signal line through the first node, the first and second inverters are turned off state. When the second holding circuit outputs the data to the first signal line through the second node, the first inverter is turned off state and the second inverter is turned on state.

[One Embodiment]

A nonvolatile semiconductor device according to an embodiment will be described using FIG. 1. In the present embodiment, a precharge scheme is not used in writing and reading. For example, in writing, the potential of a data bus is set to high or low using MOS transistors in a data latch, and in reading, an arithmetic circuit in a sense amplifier, which will be described below, transfers data to the data latch through the data bus. Note that the precharge scheme is to perform data transfer by precharging a data bus by a precharge circuit provided in a data controller which will be described below.

<Overall Configuration>

FIG. 1 is a schematic configuration of a NAND flash memory according to the present embodiment. As shown in the drawing, the NAND flash memory according to the present embodiment includes a memory cell array 1 (denoted as MCA in the drawing), a word-line controller 2, a sense amplifier 3, a column decoder 4, an input and output controller 5, a data input and output buffer 6, an address decoder 7, a control signal generator 8, a control voltage generator 9, and a parameter storage unit 10. First, the memory cell array 1 will be described.

The memory cell array 1 is a semiconductor memory including nonvolatile memory cell transistors MT, each of which can hold, for example, two-level or higher data. The memory cell array 1 is, for example, a NAND flash memory. A control gate of each memory cell transistor MT is connected to a corresponding word line WL, and one end of a current path of the memory cell transistor MT is connected to a corresponding bit line BL. A detailed configuration of the memory cell array 1 will be described using FIG. 2.

The word-line controller 2 functions as a row decoder. Specifically, the word-line controller 2 selects memory cell transistors MT in a row direction in the memory cell array 1 and transfers a required voltage produced by the control voltage generator 9, to the selected memory cell transistors MT.

Next, the sense amplifier 3 will be described. The sense amplifier 3 is connected to bit lines BL of the memory cell array 1. The sense amplifier 3 has the function of reading from and writing to the memory cell transistors MT.

Next, the column decoder 4 will be described. The column decoder 4 outputs a column select signal which selects a bit line of the memory cell array 1, according to an output signal from the address decoder 7.

Next, the input and output controller 5 will be described. The input and output controller 5 receives various commands, an address signal, write data, and read data which are supplied from a host device which is not shown. In writing, data is supplied to the sense amplifier 3 from the input and output controller 5 through the data input and output buffer 6. In reading, data read by the sense amplifier 3 is supplied to the input and output controller 5 through the data input and output buffer 6, and is then output to a host device which is not shown from the input and output controller 5.

In addition, an address signal supplied to the data input and output buffer 6 from the input and output controller 5 is supplied to the address decoder 7.

Furthermore, a command supplied to the data input and output buffer 6 from the input and output controller 5 is supplied to the control signal generator 8. External control signals such as a chip enable signal /CE, a write enable signal /WE, a read enable signal /RE, an address latch enable signal ALE, and a command latch enable signal CLE are supplied to the control signal generator 8 from a host device which is not shown.

Next, the address decoder 7 will be described. An address signal is supplied to the address decoder 7 from the data input and output buffer 6. The address signal decoded by the address decoder 7 is supplied to the word-line controller 2 and the column decoder 4.

Next, the control signal generator 8 will be described. The control signal generator 8 generates a control signal that controls write and erase sequences and a control signal that controls reading, based on an external control signal and a command which are supplied according to an operating mode. The control signal is supplied to the control voltage generator 9 and the address decoder 7.

Next, the control voltage generator 9 will be described. The control voltage generator 9 produces voltages required for various operations of the memory cell array 1, the sense amplifier 3, and the column decoder 4, such as a read voltage, a write voltage, a verify voltage, and an erase voltage, according to various control signals supplied from the control signal generator 8.

Next, the parameter storage unit 10 will be described. The parameter storage unit 10 is connected to the input and output controller 5 and the control signal generator 8, and stores parameters suited to the quality of the chip determined in a testing process.

<Details of the Memory Cell Array 1 and the Sense Amplifier 3>

Next, the detailed configurations of the above-described memory cell array 1 and the sense amplifier 3 will be described using FIG. 2. FIG. 2 is a block diagram of the memory cell array 1 and the sense amplifier 3. First, the memory cell array 1 will be described. As shown in the drawing, each of blocks BLK0 to BLKm includes a plurality of NAND strings 11, each of which has series-connected nonvolatile memory cell transistors MT (m is a natural number). Each NAND string 11 includes, for example, 32 memory cell transistors MT and select transistors ST1 and ST2. The memory cell transistors MT have a MONOS structure having a charge accumulation layer (e.g., an insulating film) formed on a semiconductor substrate with a gate insulating film interposed therebetween; an insulating film (hereinafter, called the block layer) formed on the charge accumulation layer and having a higher dielectric constant than the charge accumulation layer; and further a control gate electrode formed on the block layer. The charge accumulation layer is not limited to an insulating film and may be formed of polysilicon. Note that the number of memory cell transistors MT is not limited to 32 and may be 64, 128, 256, etc., and such a number is not limited. Note also that adjacent memory cell transistors MT share their source and drain. The memory cell transistors MT are arranged between select transistors ST1 and ST2 such that their current paths are connected in series. A drain region on the one end side of the series-connected memory cell transistors MT is connected to a source region of select transistor ST1, and a source region on the other end side of the series-connected memory cell transistors MT is connected to a drain region of select transistor ST2.

The control gate electrodes of memory cell transistors MT arranged in the same row are commonly connected to any one of word lines WL0 to WL31, and the gate electrodes of select transistors ST1 and ST2 for the memory cell transistors MT arranged in the same row are commonly connected to select gate lines SGD and SGS, respectively. Note that, for simplification of description, in the following, when the word lines WL0 to WL31 are not distinguished, they may be simply called a word line WL. Note also that the drains of select transistors ST1 arranged in the same column in the memory cell array 1 are commonly connected to any one of bit lines BL0 to BLn. In the following, for the bit lines BL0 to BLn, too, when they are not distinguished, they are collectively called a bit line BL (n is a natural number). The sources of select transistors ST2 are commonly connected to a source line SL.

Data is simultaneously written to a plurality of memory cell transistors MT that are connected to the same word line WL, and this unit is called a page. Furthermore, data in a plurality of NAND strings 11 is simultaneously erased on a block BLK basis.

Next, the sense amplifier 3 will be described. The sense amplifier 3 includes a plurality of sense amplifier units (denoted as SAU in the drawing) 3a; and data controller units (denoted as DCU in the drawing) 3b, the number of which is equal to the number of the sense amplifier units 3a. For example, a signal line through which data read from memory cell transistors MT is transferred to the data input and output buffer 6 via a corresponding sense amplifier unit 3a and a corresponding data controller unit 3b is a data bus 15.

In reading, each sense amplifier unit 3a senses data read from a memory cell transistor MT onto a corresponding bit line BL, and temporarily holds the data. Thereafter, the data is transferred to the data input and output buffer 6 through a corresponding data controller unit 3b. In addition, each sense amplifier unit 3a temporarily holds data supplied from a corresponding data controller unit 3b, and transfers the data to a corresponding bit line BL. Specifically, each sense amplifier unit 3a determines whether the data is binary 0 or binary 1 according to the potential of a corresponding precharged bit line BL which will be described later, and reads the data from a memory cell transistor MT or writes the data to a memory cell transistor MT.

Figure 3:
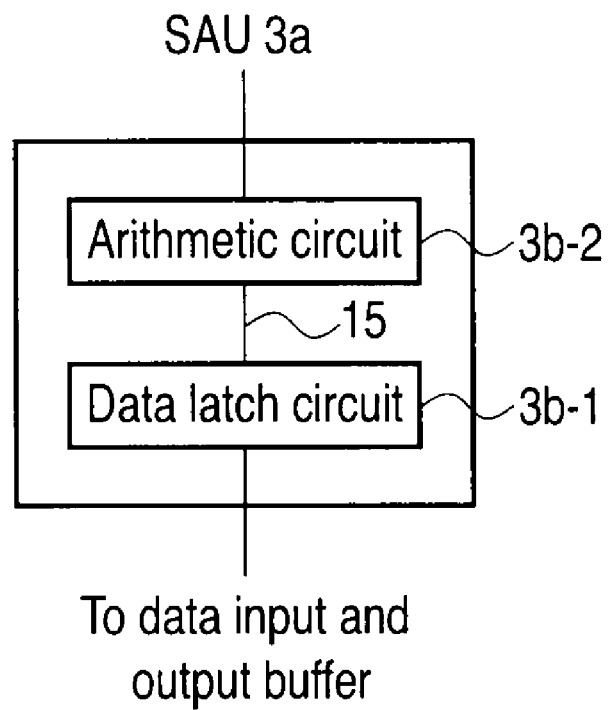
FIG. 3 is a block diagram of a data controller according to the embodiment.

Next, the data controller units 3b will be described using FIG. 3. FIG. 3 is a block diagram of a data controller unit 3b. As shown in the drawing, the data controller unit 3b includes a data latch circuit 3b-1 and an arithmetic circuit 3b-2. Note that, although the data controller unit 3b includes a precharge circuit in addition to the data latch circuit 3b-1 and the arithmetic circuit 3b-2, description thereof is omitted in the present embodiment. First, the data latch circuit 3b-1 will be described.

The data latch circuit 3b-1 holds write data supplied from an external source and transfers the data to memory cell transistors MT, and holds data read from a corresponding sense amplifier unit 3a.

The arithmetic circuit 3b-2 can process data held in the data latch circuit 3b-1 or a corresponding sense amplifier unit 3a. Specifically, the arithmetic circuit 3b-2 performs operations corresponding to, for example, AND, NAND, OR, and inversion on the held data, and supplies results of the operations to the sense amplifier unit 3a or the data latch circuit 3b-1.

The case of performing operations on held data and supplying results of the operations to the sense amplifier unit 3a will be described as an example. The arithmetic circuit 3b-2 performs operations ("AND", "NAND", "OR", and inversion) between data held in a data latch 0DLe and data held in a data latch 4DLe in the data latch circuit 3b-1 which will be described later. Likewise, the arithmetic circuit 3b-2 performs operations between data held in a data latch 1DLe and data held in a data latch 5DLe, ..., between data held in a data latch 3DLe and data held in a data latch 7DLe. The same operations are also performed on data latches 0DLo to 7DLo and thus description thereof is omitted.

Next, returning to FIG. 2, MOS transistors TR0 to TRn will be described. One end of a current path of each of MOS transistors TR0 to TRn is connected to a corresponding data controller unit 3b, and the other end of the current path is connected to the data input and output buffer 6. Note that, when MOS transistors TR0 to TRn are not distinguished, they are simply called a MOS transistor TR. Column select signals SEL0 to SELn are provided to the gates of MOS transistors TR0 to TRn, respectively. Note also that, when column select signals SEL0 to SELn are not distinguished, they are simply called a column select signal SEL.

In reading, when a MOS transistor TR is turned on state by a column select signal SEL, data held in a corresponding sense amplifier unit 3a is transferred to the data input and output buffer 6.

In writing, when a MOS transistor TR is turned on state by a column select signal SEL, data supplied from the data input and output buffer 6 is written to a memory cell transistor MT through the MOS transistor TR and the sense amplifier 3.

In the above-described write operation (program operation) and the above-described read operation (including a program verify operation [verify operation]), the bit lines BL connected to the sense amplifier units 3a are selected and any one of the word lines WL0 to WL31 is selected. By applying a write or read potential to all memory cell transistors MT connected to the selected word line WL, write or read operations are performed simultaneously.

Note that in FIG. 2 one bit line BL is connected to one sense amplifier unit 3a. However, the configuration is not limited thereto. For example, one sense amplifier unit 3a may be provided for two bit lines BL. Note also that, although the data controller units 3b are connected to the sense amplifier units 3a, respectively, the configuration is not limited thereto. For example, the configuration may be such that one data controller unit 3b is provided for eight sense amplifier units 3a, and the data controller unit 3b is selectively connected to any of the sense amplifier units 3a.

Figure 4:
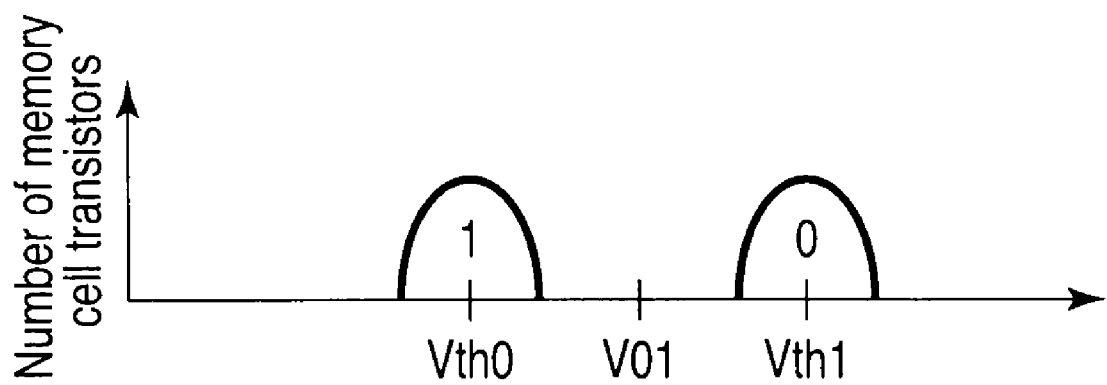
FIG. 4 is a threshold distribution of memory cell transistors according to the embodiment.

Next, a threshold distribution of the above-described memory cell transistors MT will be described using FIG. 4. FIG. 4 is a graph in which the threshold distribution is plotted on the horizontal axis and the probability of the presence of the memory cell transistors MT is plotted on the vertical axis.

As shown in the drawing, each memory cell transistor MT can hold, for example, two-level data (one-bit data). Specifically, each memory cell transistor MT can hold two types of data, binary 1 and binary 0, in ascending order of threshold voltage Vth.

A threshold voltage Vth0 for binary 1 in the memory cell transistor MT is Vth0<V01. A threshold voltage Vth1 for binary 0 is V01<Vth1. As such, each memory cell transistor can hold one-bit data, binary 0 or binary 1, according to the threshold voltage. The threshold voltage fluctuates by inject-ing charges into the charge accumulation layer. The memory cell transistors MT may be allowed to hold four-level or higher data.

<Configuration of the Data Latch Circuits 3b-1>

Figure 5:
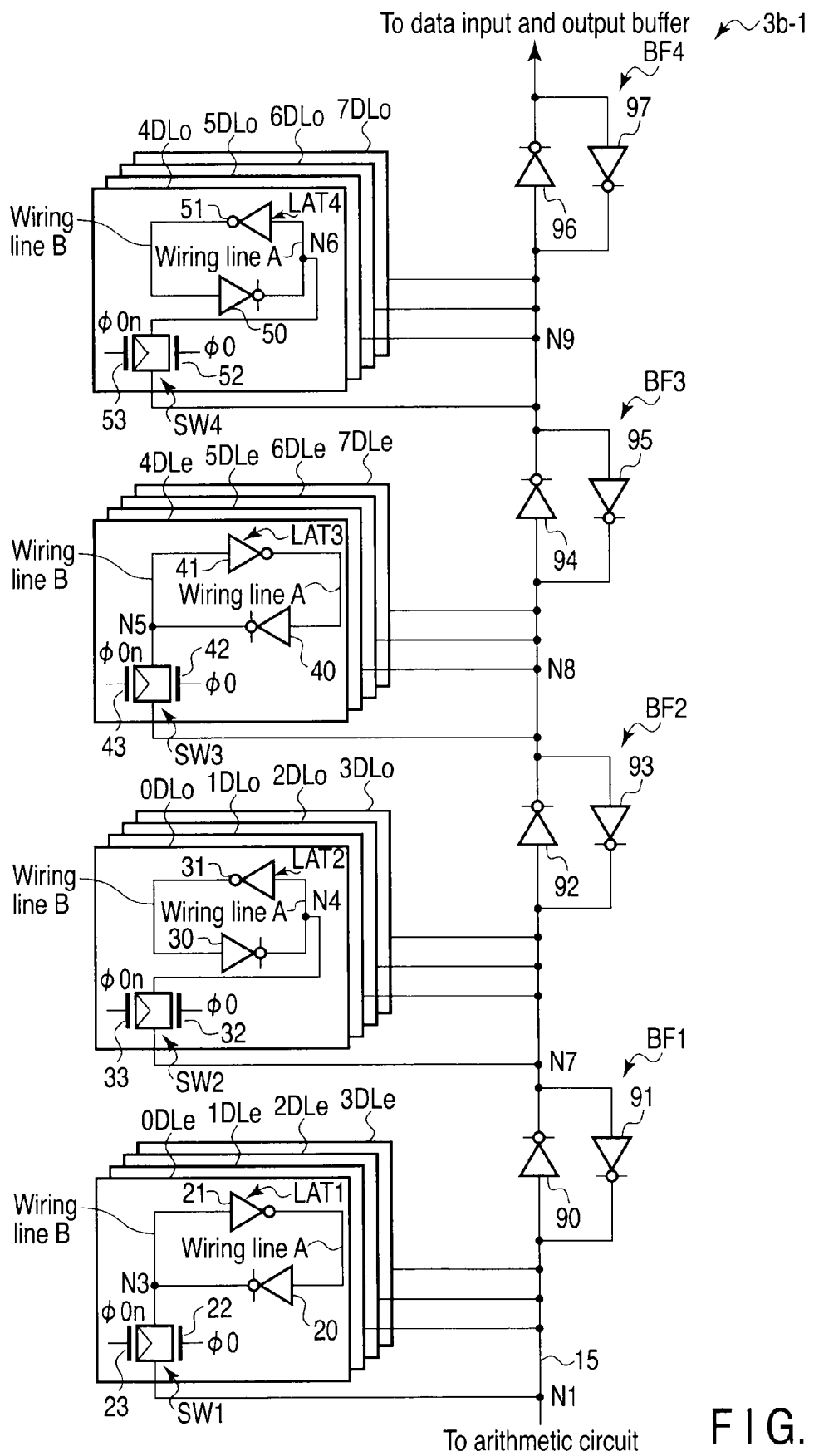
FIG. 5 is a block diagram of a data latch circuit according to the embodiment.

Next, an example of the configuration of the data latch circuits 3b-1 will be described in detail using FIG. 5. FIG. 5 is a block diagram of a data latch circuit 3b-1 according to the present embodiment. As shown in the drawing, the data latch circuit 3b-1 includes data latches 0DLe to 7DLe, data latches 0DLo to 7DLo, and buffers with switches BF1 to BF4. That is, buffers BF1 to BF4 are either on or off state. The control signal generator 8 controls whether buffers BF1 to BF4 are on or off state. Although here, as an example, the data latch circuit 3b-1 includes 16 data latches DL, the number of data latches is not limited thereto. In the following, a portion of the data bus 15 between buffers BF1 and BF2, a portion of the data bus 15 between buffers BF2 and BF3, a portion of the data bus 15 between buffers BF3 and BF4, and a portion of the data bus 15 that connects buffer BF1 to the arithmetic circuit 3b-2 are all equal in length.

First, data latch 0DLe will be described. Data latch 0DLe includes a latch circuit LAT1 and a switching element SW1. LAT1 includes inverters 20 and 21. Switching element SW1 is formed by a p-channel MOS transistor 22 and an n-channel MOS transistor 23.

Inverter 21 inverts a signal at a node N3. The signal inverted by inverter 21 is input to an input terminal of inverter 20. In addition, a signal inverted by inverter 20 is provided to an input terminal of inverter 21 and node N3. As such, inverters 20 and 21 function as the latch circuit LAT1. Here, a signal line connecting an output terminal of inverter 21 to the input terminal of inverter 20 is referred to as a wiring line A. A signal line connecting an output terminal of inverter 20 to the input terminal of inverter 21 is referred to as a wiring line B. Data on the wiring line B has a value corresponding to on the potential of the data bus 15. The wiring line A holds data inverted by inverter 21. In the following, data held in LAT1 represents data (potential) on the wiring line A.

One end of a current path of MOS transistor 22 is connected to node N3, the other end is connected to a node N1, and a signal $\phi 0$ is provided to a gate of MOS transistor 22. One end of a current path of MOS transistor 23 is commonly connected to the current path of MOS transistor 22 at node N3, the other end is also commonly connected to the other end of the current path of MOS transistor 22 at node N1, and an inverted signal $\phi 0n$ of signal $\phi 0$ is provided to a gate of MOS transistor 23. MOS transistors 22 and 23 function as a transfer gate. That is, when switching element SW1 is turned on state, data at node N3 is exchanged with the data bus 15 through switching element SW1.

The configuration of data latch 0DLe has been described above. Since data latches 1DLe to 3DLe also have the same configuration as data latch 0DLe, description thereof is omitted. Therefore, data latches 0DLe to 3DLe can be selectively connected to the data bus 15. Specifically, each of data latches 1DLe to 3DLe includes a transfer gate and a latch. In reading and writing, input and output of data are sequentially performed between the latches and the data bus 15, according to the timing of signals supplied to the transfer gates.

Next, data latch 0DLo will be described. Data latch 0DLo includes a latch circuit LAT2 and a switching element SW2. LAT2 includes inverters 30 and 31. Switching element SW2 is formed by a p-channel MOS transistor 33 and an n-channel MOS transistor 32.

Inverter 31 inverts a signal at a node N4. The signal inverted by inverter 31 is input to an input terminal of inverter 30. In addition, a signal inverted by inverter 30 is provided to an input terminal of inverter 31 and node N4. As such, as with the above, inverters 30 and 31 function as the latch circuit LAT2. Here, too, a signal line connecting an output terminal of inverter 31 to the input terminal of inverter 30 is called a wiring line B, and a signal line connecting an output terminal of inverter 30 to the input terminal of inverter 31 is called a wiring line A. That is, the potential (data) of the wiring line A depends on the potential of the data bus 15. The potential of the wiring line B is the inverse of the potential of the wiring line A. In the following, data held in LAT2 represents data (potential) on the wiring line A.

One end of a current path of MOS transistor 32 is connected to node N4, the other end is connected to the data bus 15 at a node N7, and a signal φ0 is provided to a gate of MOS transistor 32. One end of a current path of MOS transistor 33 is commonly connected to the current path of MOS transistor 32 at node N4, the other end is also commonly connected to the other end of the current path of MOS transistor 32 at node N7, and an inverted signal φ0n of signal φ0 is provided to a gate of MOS transistor 33. MOS transistors 32 and 33 function as a transfer gate. That is, when switching element SW2 is turned on state, data at node N4 is exchanged with the data bus 15 through switching element SW2.

The configuration of data latch 0DLo has been described above. Since data latches 1DLo to 3DLo also have the same configuration as data latch 0DLo, description thereof is omitted. Data latches 0DLo to 3DLo can be selectively connected to the data bus 15. Specifically, each of data latches 1DLo to 3DLo includes a transfer gate and a latch. In reading and writing, input and output of data are sequentially performed between the latches and the data bus 15 according to the timing of signals supplied to the transfer gates.

Next, data latch 4DLe will be described. Data latch 4DLe has such a configuration that inverters 20 and 21 included in LAT1 and MOS transistors 22 and 23, which are included in the above-described data latch 0DLe, are replaced by inverters 40 and 41 and MOS transistors 42 and 43, respectively. That is, MOS transistors 42 and 43 function as a switching element SW3. In addition, inverters 40 and 41 function as a latch circuit LAT3. Node N3 is replaced by a node N5, and one ends of current paths of MOS transistors 42 and 43 connected to the data bus 15 are a node N8.

Except for the above-described configuration, data latches 5DLe to 7DLe, including data latch 4DLe, have the same configuration as data latch 0DLe, and thus, description thereof is omitted. Therefore, data latches 4DLe to 7DLe can be selectively connected to the data bus 15. Specifically, each of data latches 5DLe to 7DLe includes a transfer gate and a latch. In reading and writing, input and output of data are sequentially performed between the latches and the data bus 15 according to the timing of signals supplied to the transfer gates.

Finally, data latch 4DLo will be described. Data latch 4DLo has such a configuration that inverters 30 and 31 included in LAT2 and MOS transistors 32 and 33, which are included in the above-described data latch 0DLo, are replaced by inverters 50 and 51 and MOS transistors 52 and 53, respectively. MOS transistors 52 and 53 function as a switching element SW4. Inverters 50 and 51 function as a latch circuit LAT4. Node N4 is replaced by a node N6, and one ends of current paths of MOS transistors 52 and 53 connected to the data bus 15 are a node N9.

Except for the above-described configuration, data latches 5DLo to 7DLo, including data latch 4DLo, have the same configuration as data latch 0DLo, and thus, description thereof is omitted. Therefore, data latches 4DLo to 7DLo can be selectively connected to the data bus 15. Specifically, each of data latches 5DLo to 7DLo includes a transfer gate and a latch. In reading and writing, input and output of data are sequentially performed between the latches and the data bus 15 according to the timing of signals supplied to the transfer gates.

Next, the configuration of the buffers with switches BF1 to BF4 will be described. First, buffer BF1 will be described.

Buffer BF1 includes inverters 90 and 91. Inverters 90 and 91 have, as described above, a switching function. That is, inverters 90 and 91 can be either on or off state, based on a signal from the control signal generator 8. The same also applies to inverters 92 to 97 which will be described below.

Inverter 90 inverts a signal at node N1 and outputs the inverted signal to node N7. Inverter 91 inverts a signal at node N7 and outputs the inverted signal to node N1.

Next, buffer BF2 will be described. Buffer BF2 includes inverters 92 and 93. Inverter 92 inverts a signal at node N7 and outputs the inverted signal to node N8. Inverter 93 inverts a signal at node N8 and outputs the inverted signal to node N7.

Next, buffer BF3 will be described. Buffer BF3 includes inverters 94 and 95. Inverter 94 inverts a signal at node N8 and outputs the inverted signal to node N9. Inverter 95 inverts a signal at node N9 and outputs the inverted signal to node N8.

Finally, buffer BF4 will be described. Buffer BF4 includes inverters 96 and 97. Inverter 96 inverts a signal at node N9 and outputs the inverted signal to the data input and output buffer 6. Inverter 97 inverts a signal supplied from the data input and output buffer 6, and outputs the inverted signal to node N9.

<Configuration of Buffers BF1 to BF4>

Figure 6:
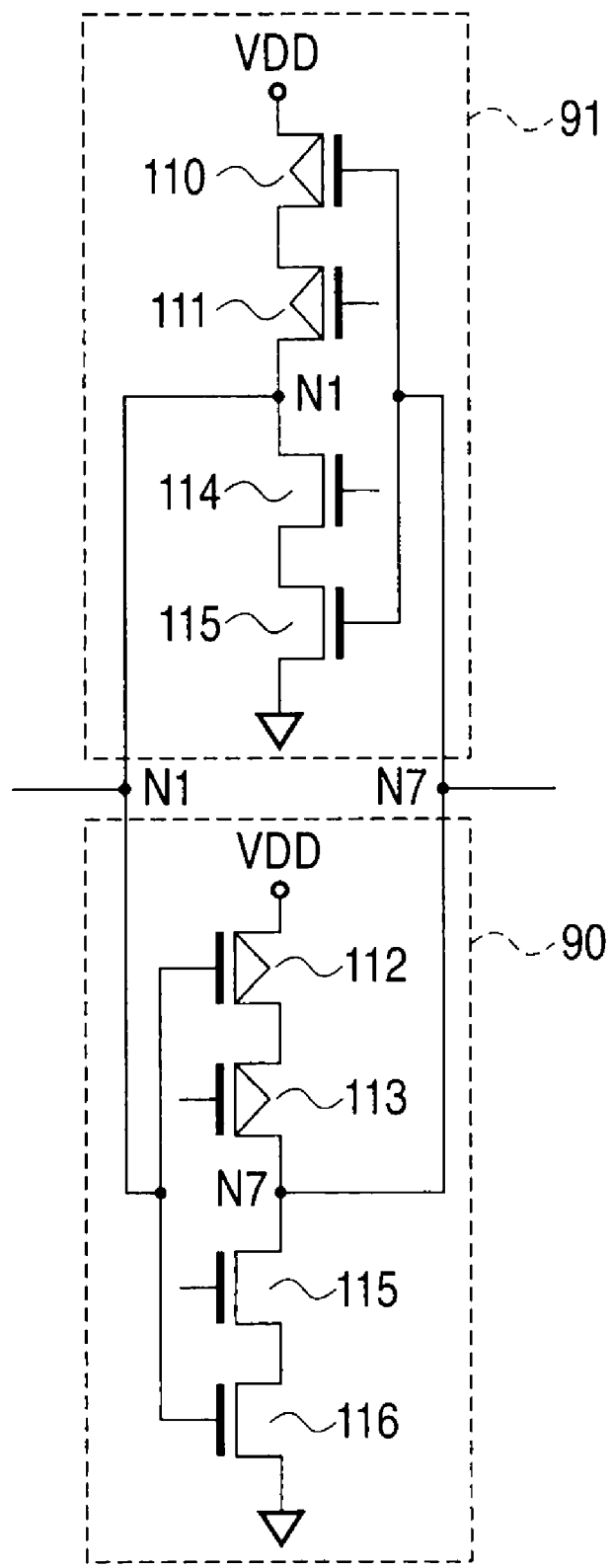
FIG. 6 is a circuit diagram of a buffer according to the embodiment.

Next, a detailed configuration of buffers BF1 to BF4 will be described using FIG. 6. Since buffers BF1 to BF4 have the same configuration, in the following, description is given with reference to buffer BF1. FIG. 6 is a circuit diagram of buffer BF1. As shown in the drawing, inverters 90 and 91 include p-channel MOS transistors 110 to 113 and n-channel MOS transistors 114 to 116.

First, the configuration of inverter 91 will be described. In inverter 91, an internal voltage VDD is applied to one end of a current path of MOS transistor 110, the other end is connected to one end of a current path of MOS transistor 111, and node N7 is connected to a gate of MOS transistor 110. The other end of the current path of MOS transistor 111 is connected to node N1.

One end of a current path of MOS transistor 114 is connected to the other end of the current path of MOS transistor 111 at node N1, and the other end is connected to one end of a current path of MOS transistor 115. The other end of the current path of MOS transistor 115 is grounded, and node N7 is connected to a gate of MOS transistor 115.

That is, when the potential of node N7 is at low, MOS transistor 110 is turned on state and MOS transistor 115 is turned off state. When MOS transistor 111 is turned on state by the control signal generator 8, a voltage VDD is applied to node N1. That is, the potential of node N1 is set to high. On the other hand, when the potential of node N7 is at high, MOS transistor 110 is turned off state and MOS transistor 115 is turned on state. When MOS transistor 114 is turned on state by the control signal generator 8, node N1 is set to ground potential. That is, the potential of node N1 is set to low.

Next, the configuration of inverter 90 will be described. In inverter 90, an internal voltage VDD is applied to one end of a current path of MOS transistor 112, the other end is connected to one end of a current path of MOS transistor 113, and node N1 is connected to a gate of MOS transistor 112. The other end of the current path of MOS transistor 113 is connected to node N7.

One end of a current path of MOS transistor 115 is connected to the other end of the current path of MOS transistor 113 at node N7, and the other end is connected to one end of a current path of MOS transistor 116. The other end of the current path of MOS transistor 116 is grounded, and node N1 is connected to a gate of MOS transistor 116.

That is, when the potential of node N1 is at low, MOS transistor 112 is turned on state and MOS transistor 116 is turned off state. When MOS transistor 113 is turned on state by the control signal generator 8, a voltage VDD is applied to node N7. That is, the potential of node N7 is set to high. On the other hand, when the potential of node N1 is at high, MOS transistor 112 is turned off state and MOS transistor 116 is turned on state. When MOS transistor 115 is turned on state by the control signal generator 8, node N7 is set to ground potential. That is, the potential of node N7 is set to low.

<Write Operations (from a Host to a Data Latch Circuit 3b-1)>

Next, write operations in the above-described configuration will be described using FIGS. 7 to 10. FIGS. 7 to 10 are conceptual diagrams showing how write data is transferred from a host to a data latch circuit 3b-1.

Figure 7:
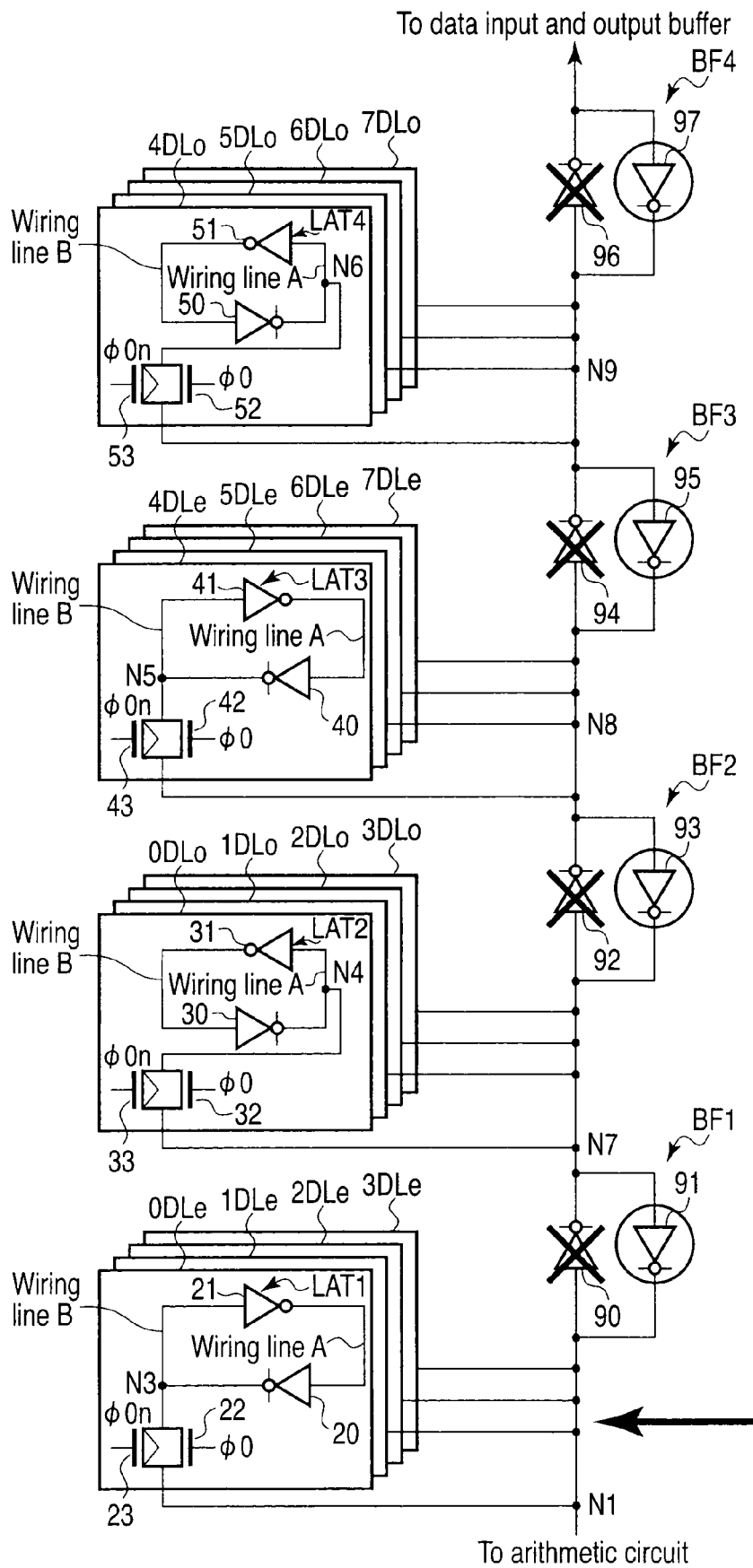

FIG. 7 shows how write data is transferred from the host to data latches 0DLe to 3DLe in the data latch circuit 3b-1. Since write operations performed on data latches 0DLe to 3DLe are all the same, here, description is given with reference only to data latch 0DLe.

First, the control signal generator 8 turns inverters 91, 93, 95, and 97 included in buffers BF1 to BF4, and switching element SW1 on state. Specifically, by setting a signal φ0 to high and setting a signal φ0n to low, MOS transistors 22 and 23 are turned on state. In this manner, data transferred from the host is stored in LAT1 in data latch 0DLe.

For example, when, as a result of transferring data from the host, the potential of node N1 is set to high, the potential of node N3 is also set to high. As a result, LAT1 stores a low, which is inverted by inverter 21. The same operation as that performed on data latch 0DLe is also performed on data latches 1DLe to 3DLe, and thus, description thereof is omitted.

Figure 8:
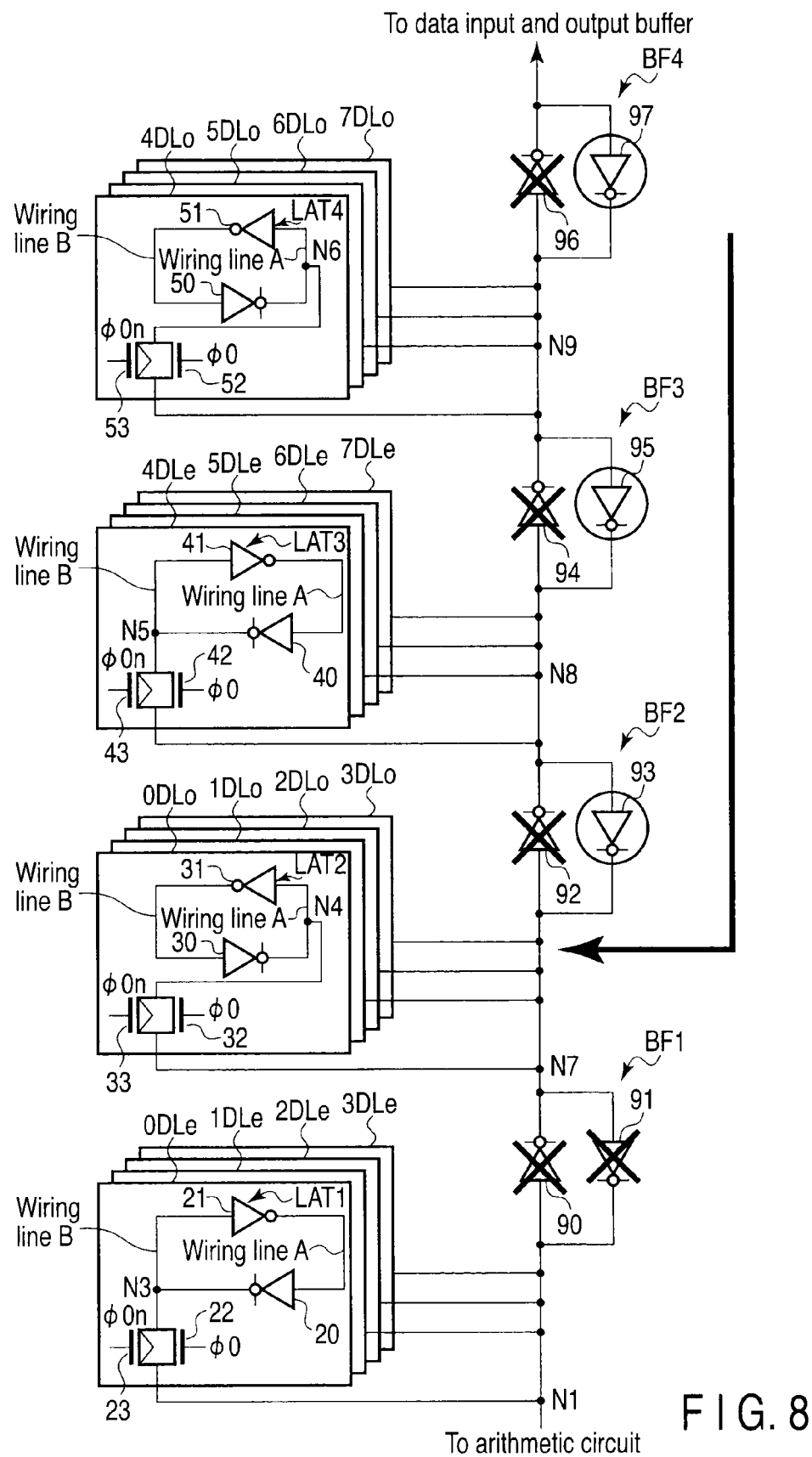

Next, FIG. 8 shows how write data is transferred from the host to data latches 0DLo to 3DLo. Note that, since write operations performed on data latches 0DLo to 3DLo are all the same, here, description is given with reference to data latch 0DLo.

First, the control signal generator 8 turns inverters 93, 95, and 97 included in buffers BF2, BF3, and BF4, and switching element SW2 on state, and turns inverter 91 off state. In this manner, data transferred from the host is stored in LAT2 in data latch 0DLo through the data bus 15, buffers BF2, BF3, and BF4, and switching element SW2.

For example, when, as a result of transferring data from the host, the potential of node N7 is set to high, a high at node N7 is stored in LAT2. The same operation as that performed on data latch 0DLo is also performed on data latches 1DLo to 3DLo, and thus, description thereof is omitted.

Figure 9:
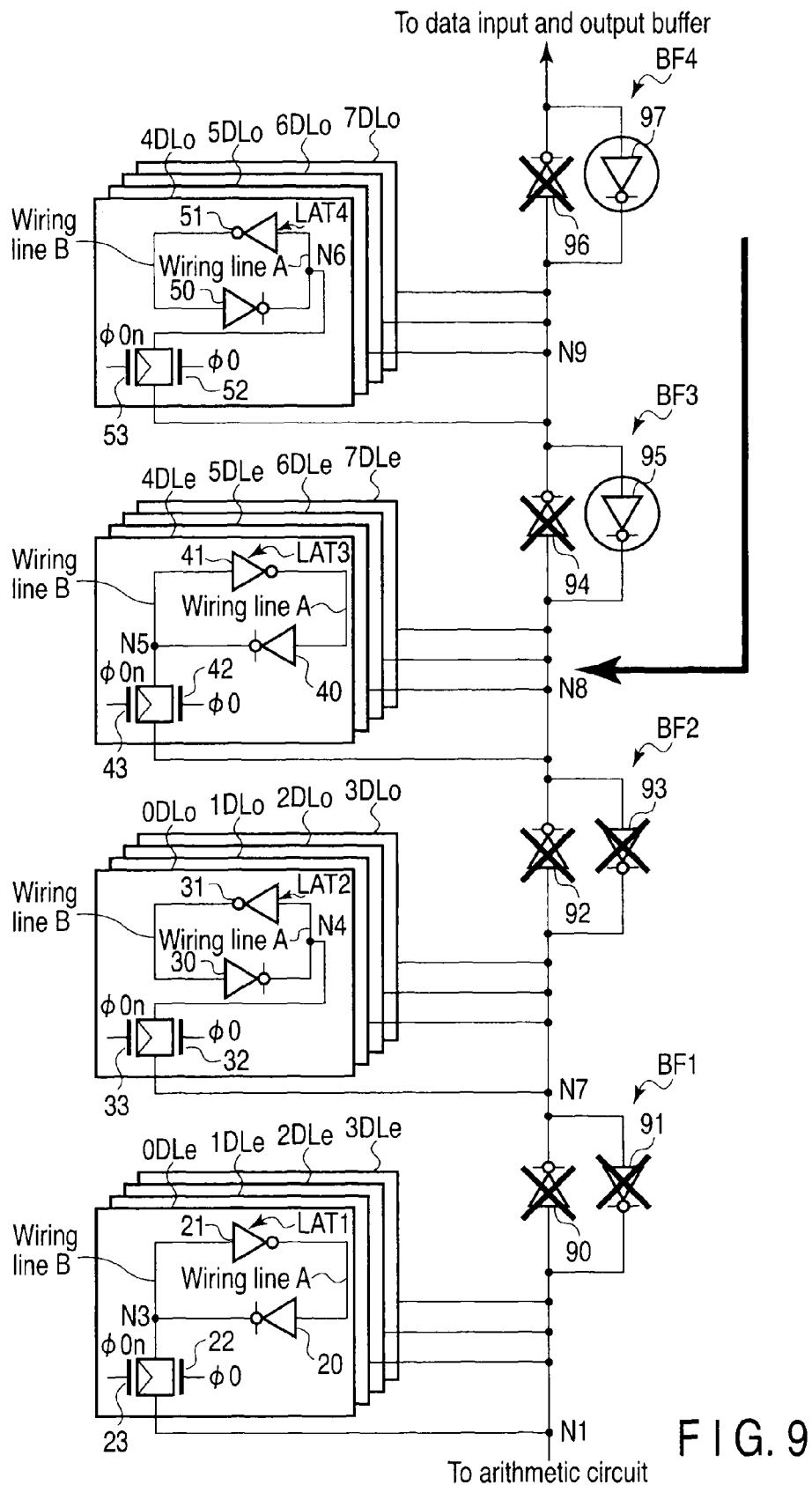

Next, FIG. 9 shows how write data is transferred from the host to data latches 4DLe to 7DLe. Note that, since write operations performed on data latches 4DLe to 7DLe are all the same, here, description is given with reference to data latch 4DLe.

First, the control signal generator 8 turns inverters 95 and 97 included in buffers BF3 and BF4, and switching element SW3 on state. The control signal generator 8 turns inverters 91 and 93 included in buffers BF1 and BF2 off state. In this manner, data transferred from the host is stored in LAT5 in data latch 4DLe through the data bus 15, buffers BF3 and BF4, and switching element SW3.

For example, when, as a result of transferring data from the host, the potential of node N8 is set to high, a low which is inverted by inverter 41 is stored in LAT5. The same operation as that performed on data latch 4DLe is also performed on data latches 5DLe to 7DLe, and thus, description thereof is omitted.

Finally, FIG. 10 shows how write data is transferred from the host to data latches 4DLo to 7DLo. Note that, since write operations performed on data latches 4DLo to 7DLo are all the same, here, description is given with reference to data latch 4DLo.

First, the control signal generator 8 turns inverter 97 included in buffer BF4 and switching element SW4 on state. The control signal generator 8 turns inverters 91, 93, and 95 included in buffers BF1 to BF3 off state. In this manner, data transferred from the host is stored in LAT4 in data latch 4DLo through the data bus 15, buffer BF4, and switching element SW4.

For example, when, as a result of transferring data from the host, the potential of node N9 is set to high, a high at node N9 is stored in LAT4. The same operation as that performed on data latch 4DLo is also performed on data latches 5DLo to 7DLo, and thus, description thereof is omitted.

<Write Operations (from the Data Latch Circuit 3b-1 to an Arithmetic Circuit 3b-2)>

Next, the operation of transferring write data stored in the above-described data latch circuit 3b-1 to an arithmetic circuit 3b-2 will be described using FIGS. 11 to 14. FIGS. 11 to 14 are conceptual diagrams showing how write data is transferred from the data latch circuit 3b-1 to the arithmetic circuit 3b-2.

Figure 11:
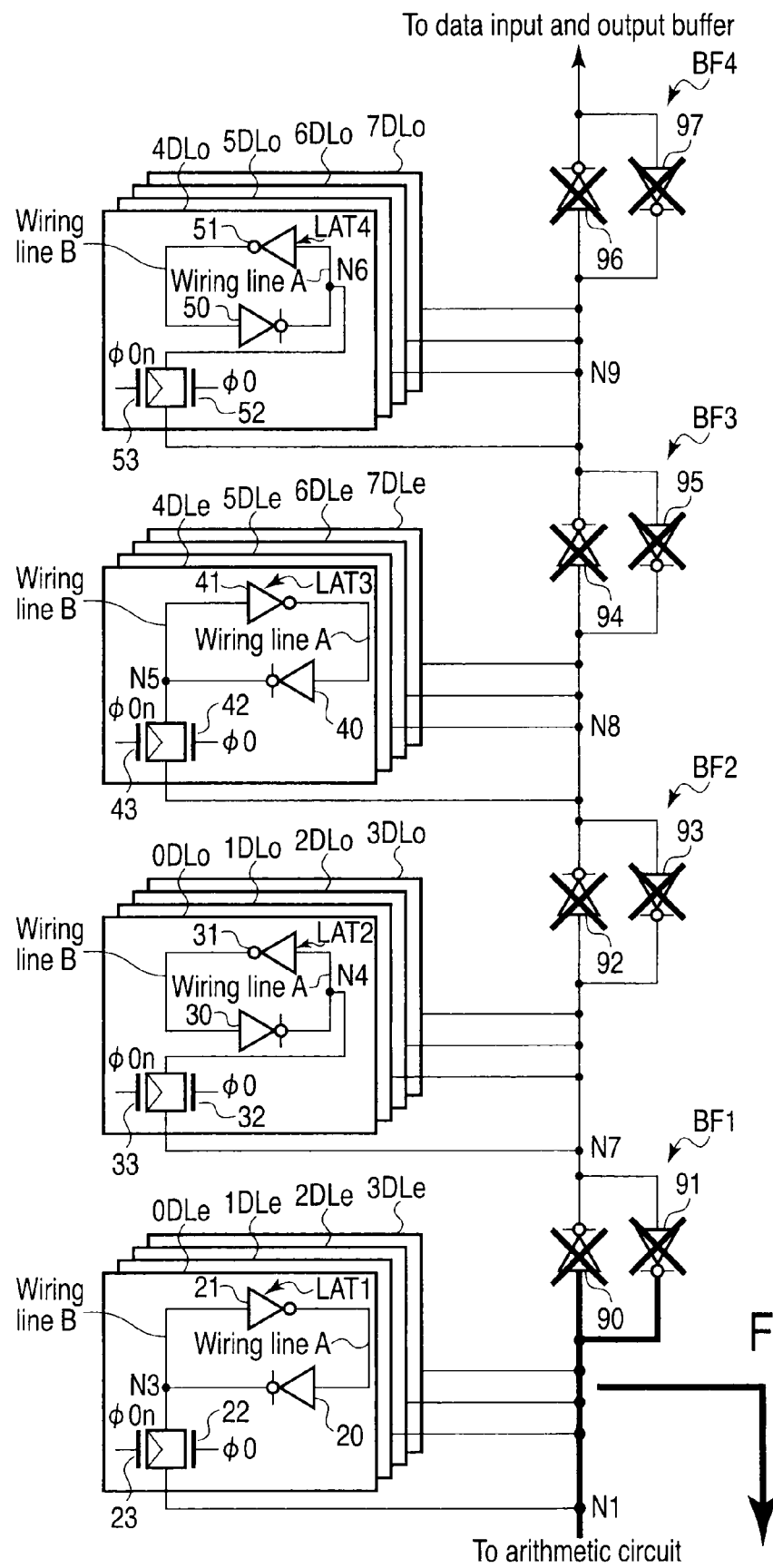

FIG. 11 shows how write data stored in data latches 0DLe to 3DLe is transferred to the arithmetic circuit 3b-2. Note that, since the operations of sequentially transferring, by data latches 0DLe to 3DLe, data to the arithmetic circuit 3b-2 are all the same, here, description is given with reference to data latch 0DLe.

As shown in FIG. 11, the control signal generator 8 turns inverters 90, 92, 94, and 96 included in buffers BF1, BF2, BF3, and BF4 off state. The control signal generator 8 further turns a switching element SW1 on state. An inverted value of data held in LAT1 is transferred to the arithmetic circuit 3b-2 through switching element SW1 and the data bus 15. Specifically, the potential of the data bus 15 (Node N1) is set according to on the potential of the wiring line B. When the potential of the wiring line B is at low, the potential of node N1 is set to low. On the other hand, when the potential of the wiring line B is at high, the potential of node N1 is set to high. An inverted value of either one of the potentials is transferred to the arithmetic circuit 3b-2. In other words, data corresponding to the potential of the wiring line A in data latch 0DLe is transferred to the arithmetic circuit 3b-2. In this case, only a heavy-line portion of the data bus shown in FIG. 11 is seen as the data bus 15. That is, the wiring line capacitance of the data bus 15 as viewed from data latch 0DLe is ¼ in size, compared with the case in which buffers BF1 to BF4 are turned on state. Therefore, the energy required to transfer data held in data latch 0DLe to the data bus 15 is ¼. The above-described data transfer is also sequentially performed on data latches 1DLe to 3DLe in the same manner, and thus, description thereof is omitted.

FIG. 12 shows how write data stored in data latches 0DLo to 3DLo is transferred to the arithmetic circuit 3b-2. Here, description is given with reference to data latch 0DLo.

As shown in FIG. 12, the control signal generator 8 turns inverters 92, 94, and 96 included in buffers BF2, BF3, and BF4 off state. Subsequently, the control signal generator 8 turns a switching element SW2 and inverter 91 on state. Here, since switching element SW2 is on state, a signal φ0 is set to high and a signal φ0n is set to low. As a result, MOS transistors 32 and 33 are turned on state. In this manner, the potential of node N7 is set according to the potential of the wiring line A. Specifically, when the potential of the wiring line A is at low, the potential of node N7 is set to low. On the other hand, when the potential of the wiring line A is at high, the potential of node N7 is set to high. Either one of the potentials of node N7 is inverted by inverter 91 and thereafter inverted data is further transferred to the arithmetic circuit 3b-2. That is, the potential of the wiring line A in data latch 0DLo is transferred to the arithmetic circuit 3b-2. In this case, a portion of the data bus (heavy-line portion) shown in FIG. 12 is seen as the data bus 15. That is, the wiring line capacitance of the data bus 15 as viewed from data latch 0DLo is ½ in size, compared with the case in which buffers BF1 to BF4 are turned on state. Therefore, the energy required to transfer data held in data latch 0DLo to the data bus 15 is ½. The above-described data transfer is also sequentially performed on data latches 1DLo to 3DLo in the same manner, and thus, description thereof is omitted.

Figure 13:
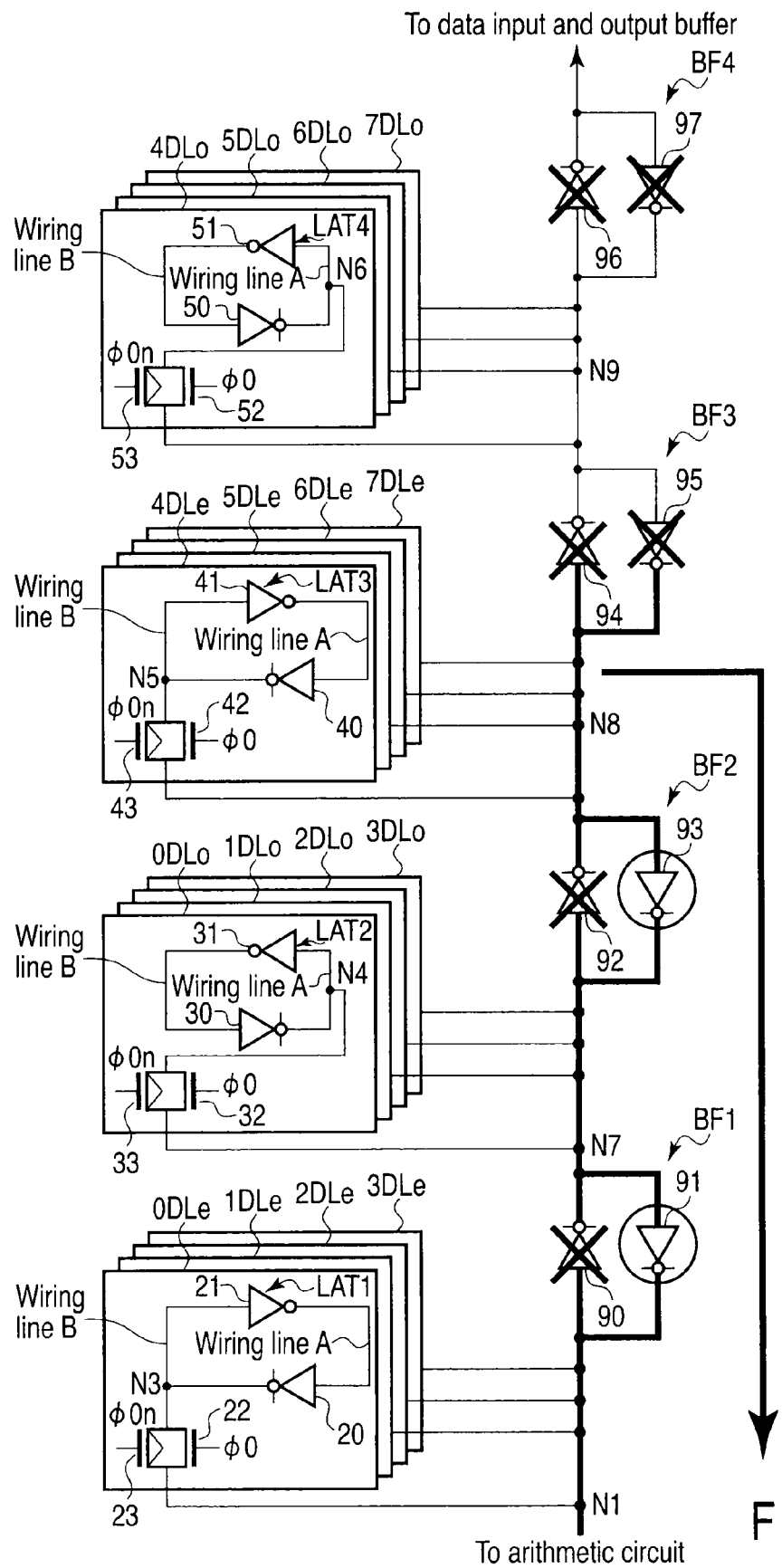

FIG. 13 shows how write data stored in data latches 4DLe to 7DLe is transferred to the arithmetic circuit 3b-2. Here, description is given with reference to data latch 4DLe.

As shown in FIG. 13, the control signal generator 8 turns inverters 94 and 96 included in buffers BF3 and BF4 off state, and turns inverters 91 and 93 included in buffers BF1 and BF2 on state. Subsequently, the control signal generator 8 turns switching element SW3 on state. Here, since switching element SW3 is on state, MOS transistors 42 and 43 are turned on state. In this manner, the potential of node N8 is set according to the potential of the wiring line B. Specifically, when the potential of the wiring line B is at low, the potential of node N8 is set to low. On the other hand, when the potential of the wiring line B is at high, the potential of node N8 is set to high. The value of either voltage is repeatedly inverted by inverters 91 and 93 and the inverted value is further transferred to the arithmetic circuit 3b-2. That is, the potential of the wiring line A in data latch 4DLe is transferred to the arithmetic circuit 3b-2. In other words, data held in LAT3 is transferred to the arithmetic circuit 3b-2. In this case, a portion of the data bus (heavy-line portion) shown in FIG. 13 is seen as the data bus 15. That is, the wiring line capacitance of the data bus 15 as viewed from data latch 4DLe is ¾ in size, compared with the case in which buffers BF1 to BF4 are turned on state. Therefore, the energy required to transfer data held in data latch 4DLe to the data bus 15 is ¾. The above-described data transfer is also sequentially performed on data latches 5DLe to 7DLe in the same manner, and thus, description thereof is omitted.

Finally, FIG. 14 shows how write data stored in data latches 4DLo to 7DLo is transferred to the arithmetic circuit 3b-2. Here, description is given with reference to data latch 4DLo.

As shown in FIG. 14, the control signal generator 8 turns inverter 96 included in buffer BF4 off state, and turns inverters 91, 93, and 95 included in buffers BF1, BF2, and BF3 on state. Subsequently, the control signal generator 8 turns switching element SW4 on state. That is, MOS transistors 52 and 53 are turned on state. In this manner, the potential of node N9 is set according to the potential of the wiring line A. Specifically, when the potential of the wiring line A is at low, the potential of node N9 is set to low. On the other hand, when the potential of the wiring line A is at high, the potential of node N9 is also set to high. A high or low at node N9 is repeatedly inverted by inverters 91, 93, and 95, and the inverted value is further transferred to the arithmetic circuit 3b-2. In other words, the data transferred to the arithmetic circuit 3b-2 depends on the potential of the wiring line A in data latch 4DLo. In this case, the wiring line capacitance as viewed from data latch 4DLo is, as shown in FIG. 14, the wiring line capacitance of the entire data bus 15 (heavy-line portion). That is, the above-described data transfer is also sequentially performed on data latches 5DLo to 7DLo in the same manner, and thus, description thereof is omitted.

Note that, as described above, the arithmetic circuit 3b-2 captures, for example, data held in data latch 0DLe and data held in data latch 4DLe, performs predetermined operations on those data, and then, transfers results of the operations to a corresponding sense amplifier unit 3a. Accordingly, in the above-described write operations, data transfer is performed in the order of, for example, data latches 0DLe, 4DLe, 1DLe, 5DLe, 2DLe, 6DLe, . . . , 0DLo, 4DLo, 1DLo, 5DLo, . . . , 3DLo, and 7DLo. Note that if, before the arithmetic circuit 3b-2 transfers data to the sense amplifier unit 3a, the arithmetic circuit 3b-2 can hold data stored in the data latches DL, then the order in which write operations are performed is not limited to that described above.

<Read Operations (from the Arithmetic Circuit 3b-2 to the Data Latch Circuit 3b-1)>

Next, the operation of storing read data stored in the arithmetic circuit 3b-2 (a sense amplifier unit 3a), in the data latch circuit 3b-1 will be described using FIGS. 15 to 18. FIGS. 15 to 18 are conceptual diagrams showing how read data is transferred from the arithmetic circuit 3b-2 which is not shown to the data latch circuit 3b-1.

FIG. 15 shows how read data is transferred from the arithmetic circuit 3b-2 to data latches 0DLe to 3DLe. Note that, since read operations performed on data latches 0DLe to 3DLe are all the same, here, description is given with reference to data latch 0DLe.

As shown in FIG. 15, the control signal generator 8 turns inverters 90, 92, 94, and 96 included in buffers BF1 to BF4 off state. Subsequently, the control signal generator 8 turns switching element SW1 on. In this manner, LAT1 (potential of the wiring line A) depends on the potential of node N1. Specifically, when the potential of node N1 is at high according to data transferred from the arithmetic circuit 3b-2, the potential of the wiring line B is set to high, i.e., LAT1 holds a low signal. On the other hand, when the potential of node N1 is at low, the potential of the wiring line B is set to low, i.e., LAT1 holds a high signal.

Here, when viewed from the arithmetic circuit 3b-2, only a portion of the data bus (heavy-line portion) shown in FIG. 15 is seen as the data bus 15. That is, the wiring line capacitance of the data bus 15 as viewed from the arithmetic circuit 3b-2 is ¼ in size, compared with the case in which buffers BF1 to BF4 are turned on state. Therefore, the energy required to transfer data held in the arithmetic circuit 3b-2 to the data bus 15 is ¼. The above-described data transfer is also sequentially performed on data latches 1DLe to 3DLe. In this case, too, since inverters 90, 92, 94, and 96 are off state, only the heavy-line portion is seen as the data bus 15. That is, since the wiring line length of the data bus 15 is ¼ of the original wiring line length, energy consumption is ¼.

Figure 16:
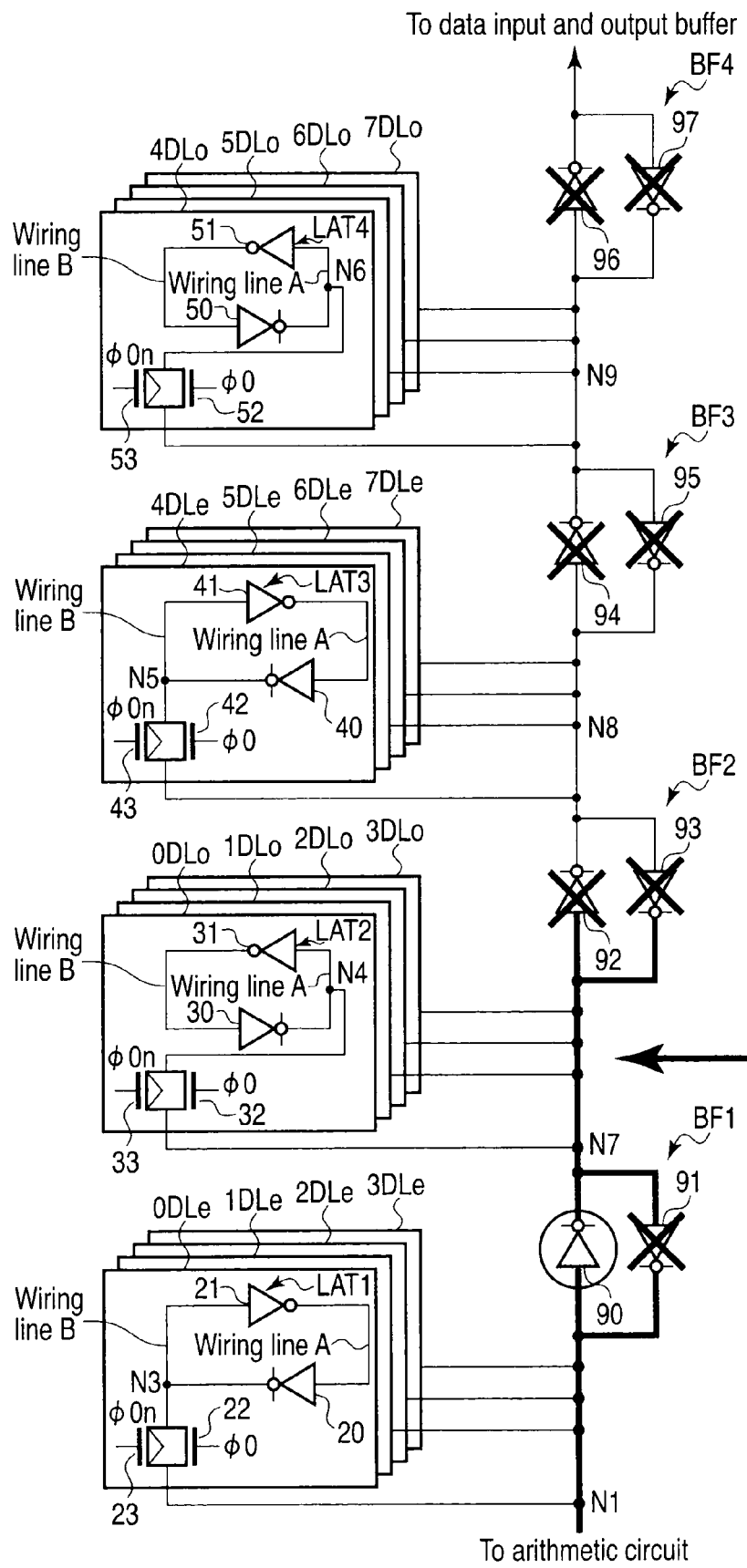

FIG. 16 shows how read data is transferred from the arithmetic circuit 3b-2 to data latches 0DLo to 3DLo. Here, description is given with reference to data latch 0DLo.

As shown in FIG. 16, the control signal generator 8 turns inverters 92, 94, and 96 included in buffers BF2 to BF4 off state, and turns inverter 90 included in buffer BF1 on state.

Subsequently, the control signal generator 8 turns switching element SW2 on state. That is, MOS transistors 32 and 33 are turned on state. In this manner, LAT2 (potential of the wiring line A) holds a value according to the potential of node N7. Specifically, when the potential of node N7 is at low, the potential of the wiring line A is set to low. On the other hand, when the potential of node N7 is at high, the potential of the wiring line A is set to high. Here, when viewed from the arithmetic circuit 3b-2, only a portion of the data bus (heavy-line portion) shown in FIG. 16 is seen as the data bus 15. That is, the wiring line capacitance of the data bus 15 as viewed from the arithmetic circuit 3b-2 is ½ in size, compared with the case in which buffers BF1 to BF4 are turned on state. Therefore, the energy required to transfer data held in the arithmetic circuit 3b-2 to the data bus 15 is ½. The above-described data transfer from the arithmetic circuit 3b-2 is also sequentially performed on data latches 1DLo to 3DLo. In this case, too, since inverters 92, 94, and 96 are off state, the heavy-line portion is seen as the data bus 15. That is, the wiring line length of the data bus 15 is ½ of the original wiring line length.

Figure 17:
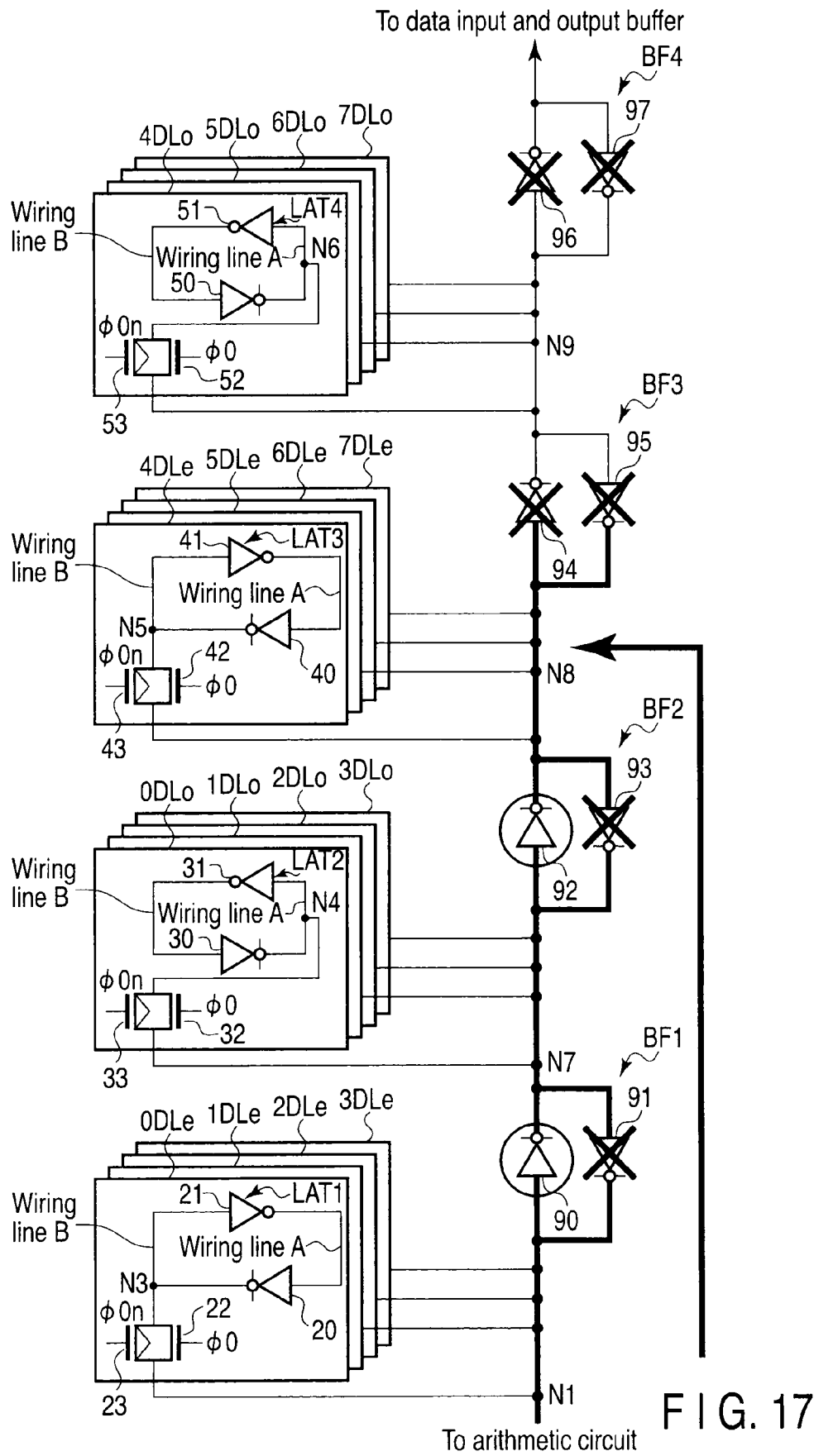

FIG. 17 shows how read data is transferred from the arithmetic circuit 3b-2 to data latches 4DLe to 7DLe. Here, description is given with reference to data latch 4DLe.

As shown in FIG. 17, the control signal generator 8 turns inverters 94 and 96 included in buffers BF3 and BF4 off state, and turns inverters 90 and 92 included in buffers BF1 and BF2 on state. Subsequently, the control signal generator 8 turns switching element SW3 on state. That is, MOS transistors 42 and 43 are turned on state. In this manner, data held in LAT3 (potential of the wiring line A) is set to a value according to the potential of node N8. Specifically, when the potential of node N8 is at high, the potential of the wiring line B is set to high, i.e., LAT3 holds a low signal. On the other hand, when the potential of node N8 is at low, the potential of the wiring line B is set to low. Here, when viewed from the arithmetic circuit 3b-2, only a heavy-line portion shown in FIG. 17 is seen as the data bus 15. That is, the wiring line length of the data bus 15 is ¾ of the original wiring line length. That is, the wiring line capacitance of the data bus 15 as viewed from the arithmetic circuit 3b-2 is ¾ in size, compared with the case in which buffers BF1 to BF4 are turned on state. Therefore, the energy required to transfer data held in the arithmetic circuit 3b-2 to the data bus 15 is ¾. The above-described data transfer from the arithmetic circuit 3b-2 is also sequentially performed on data latches 5DLe to 7DLe. In this case, too, since inverters 94 and 96 are off state, the heavy-line portion is seen as the data bus 15. That is, the wiring line length of the data bus 15 is ¾ of the original wiring line length, and thus, energy consumption is ¾.

Figure 18:
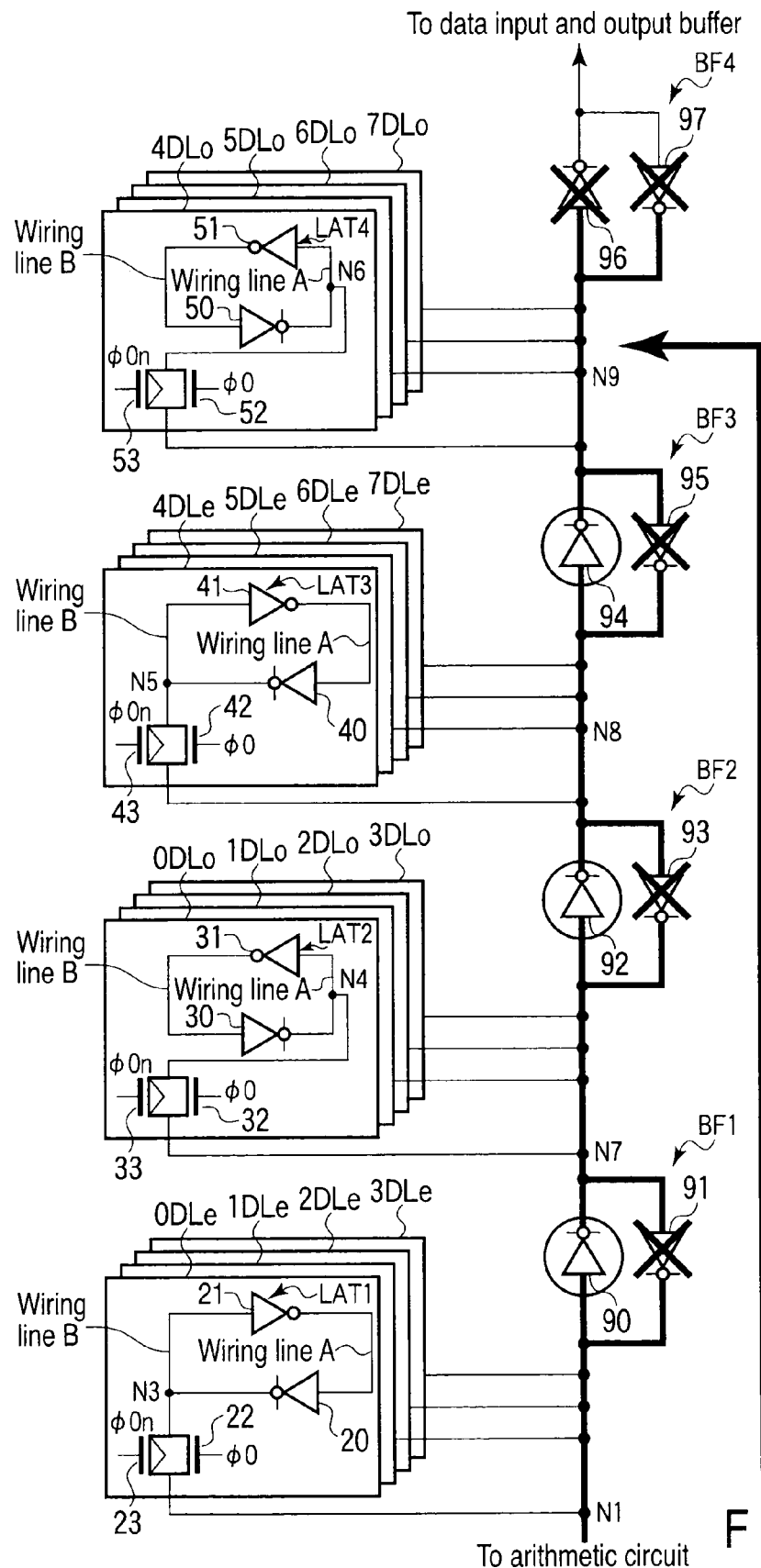

FIG. 18 shows how read data is transferred from the arithmetic circuit 3b-2 to data latches 4DLo to 7DLo. Here, description is given with reference to data latch 4DLo.

As shown in FIG. 18, the control signal generator 8 turns inverter 96 included in buffer BF4 off state, and turns inverters 90, 92, and 94 included in buffers BF1 to BF3 on state. Subsequently, the control signal generator 8 turns switching element SW4 on state. That is, MOS transistors 52 and 53 are turned on state. In this manner, data held in LAT4 (potential of the wiring line A) is set to a value according to the potential of node N9. Specifically, when the potential of node N9 is at low, the potential of the wiring line A is set to low. On the other hand, when the potential of node N9 is at high, the potential of the wiring line A is set to high. Here, when viewed from the arithmetic circuit 3b-2, a heavy-line portion shown in the drawing is seen as the data bus 15. The above-described data transfer from the arithmetic circuit 3b-2 is also sequentially performed on data latches 5DLo to 7DLo. In this case, too, since inverter 96 is off state, the heavy-line portion is seen as the data bus 15.

In a transfer circuit and a nonvolatile semiconductor device using the transfer circuit, according to the present embodiment, a data latch circuit 3b-1 that temporarily holds data includes a plurality of buffers BF. Each buffer BF is inserted into the data bus 15 such that it is sandwiched between data latches DLo and data latches DLe. By turning the buffer BF on or off state, the wiring line capacitance of the data bus 15 as viewed from data latches DLe or data latches DLo can be reduced. Since the energy consumed is also the same for the case of transferring data from the arithmetic circuit 3b-2 to the data latches DL, here, the case of transferring data held in the data latches DL to the arithmetic circuit 3b-2 is considered. In the following, the case in which, for example, data latch 0DLe transfers data to the arithmetic circuit 3b-2 is considered.

Since inverters 90, 92, 94, and 96 are off state, data latch 0DLe does not need to consider the wiring line capacitance of those portions other than the heavy-line portion. That is, the capacitance of the data bus 15 as viewed from data latch 0DLe is only that of the heavy-line portion, i.e., the wiring line capacitance of the data bus 15 is ¼ of the original wiring line capacitance. Therefore, even if data latch 0DLe is formed by transistors with minimum processing dimensions, the potential of node N1 can be set to high or low according to the potential of node N3. That is, since the wiring line capacitance of the data bus 15 as viewed from data latch 0DLe is small, even if transistors have a low current driving force, the transistors can drive the heavy-line portion of the data bus 15. In addition, since the wiring line capacitance is small, energy consumption can be reduced. Note that the reason that MOS transistors with minimum processing dimensions are used in the data latches DL is to give priority to a reduction in area.

This aspect will be described using FIG. 19. FIG. 19 is a circuit diagram of data latch 0DLe. Note that data latches 1DLe to 7DLe also have the same circuit configuration and thus description thereof is omitted. As shown in the drawing, data latch 0DLe includes p-channel MOS transistors 100 to 102 and n-channel MOS transistors 103 to 105, in addition to the aforementioned MOS transistors 22 and 23.

For example, a voltage VDD is supplied to one end of a current path of MOS transistor 100, the other end of the current path is connected to a node N10, and a gate of MOS transistor 100 is connected to a node N1. One end of a current path of MOS transistor 103 is commonly connected to the other end of the current path of MOS transistor 100 at node N10, and the other end of the current path is grounded, and a gate of MOS transistor 103 is connected to node N1. Since node N1 is connected to the data bus 15 through switching element SW1, MOS transistors 100 and 103 are either on or off state, according to the potential of the data bus 15.

In addition, for example, a voltage VDD is supplied to one end of a current path of MOS transistor 101, the other end of the current path is connected to one end of a current path of MOS transistor 102, and node N10 is connected to a gate of MOS transistor 101. The other end of the current path of MOS transistor 102 is connected to node N1, and a signal Enable1 is supplied to a gate of MOS transistor 102.

Furthermore, one end of a current path of MOS transistor 104 is connected to the other end of the current path of MOS transistor 102 at node N1, the other end of the current path is connected to one end of a current path of MOS transistor 105, and node N10 is connected to a gate of MOS transistor 104. The other end of the current path of MOS transistor 105 is grounded, and a signal Enable2 is supplied to a gate of MOS transistor 105.

In the above-described configuration, when data latch 0DLe stores data, signals Enable1 and Enable2 are made high and low, respectively. When the potential of node N1 is at high because of the data bus 15, MOS transistor 103 is turned on state and MOS transistor 100 is turned off state. Hence, since node N10 is grounded through MOS transistor 103, node N10 is set to, for example, 0 V. That is, node N10 is made low.

A potential representing low at node N10 is transferred to the gates of MOS transistors 101 and 105. As a result, MOS transistor 101 is turned on state and MOS transistor 105 is turned off state. As described above, since signal Enable1 is high and signal Enable2 is low, MOS transistors 102 and 104 are turned off state. Therefore, LAT1 holds a potential corresponding low.

When the data held in LAT1 is transferred to the data bus 15, signal Enable1 is made low. As a result, a voltage VDD corresponding high is transferred to the data bus 15 through MOS transistors 101 and 102, node N1, and switching element SW1. Specifically, a potential lower by the thresholds of MOS transistors 101 and 102 is transferred to the data bus 15. Note that, when LAT1 holds a high, signals Enable1 and Enable2 are made high. In this manner, the potential of node N1 is set to low.

As such, even if MOS transistors 101 and 102 are formed in minimum processing dimensions and thus have a low current driving force, since the wiring line capacitance of the data bus 15 is as small as ¼ of the original wiring line capacitance, the potential of the data bus 15 leading to the arithmetic circuit 3b-2 can be precharged by data latch 0DLe. Since the wiring line capacitance of the data bus 15 is ¼ of that for conventional cases, the energy required to precharge the data bus 15 by data latch 0DLe can also be reduced. Note that the energy consumption can also be similarly reduced in data latches 1DLe to 3DLe.

When data held in data latches 0DLo to 3DLo is transferred to the data bus 15, since the heavy-line portion shown in FIG. 12 functions as the data bus 15, the energy required to precharge the data bus 15 by data latches 0DLo to 3DLo is ½ of that for conventional cases.

Likewise, when data held in data latches 4DLe to 7DLe is transferred to the data bus 15, since the heavy-line portion shown in FIG. 13 functions as the data bus 15, the energy required to precharge the data bus 15 by data latches 4DLe to 7DLe is ¾ of that for conventional cases.

Finally, when data held in data latches 4DLo to 7DLo is transferred to the data bus 15, the potential of the data bus 15 needs to be precharged.

From the above, the energy consumed by data latches 0DLe to 7DLe and data latches 0DLo to 7DLo during writing is:

$$\tfrac{1}{4} \times 4 + \tfrac{1}{2} \times 4 + \tfrac{3}{4} \times 4 + 1 \times 4 = 10 \quad (1).$$

It is assumed that the energy consumed when precharging the entire data bus 15 is 1, and 16 data transfers are performed. In this case, 16 units of energy are consumed. On the other hand, in the present embodiment, from equation (1), precharging the entire data bus 15 requires only 10 units of energy, and thus, the energy consumption can be reduced to, for example, $10/16$.

Note that the same also applies to the case of lowering the potential of the data bus 15 to, for example, zero. That is, even if MOS transistors 102 and 104 are formed in minimum processing dimensions and thus have a low current driving force, the potential of the data bus 15 can be rapidly lowered to zero.

As described above, even if inverters forming a data latch circuit are formed by transistors formed in minimum processing dimensions, since, as described above, the data bus 15 has a small capacitance, the potential of the data bus 15 can be increased and potentials (data) held in the inverters can be transferred to the arithmetic circuit 3b-2.

That is, there is no need to precharge a data bus 15 with a large wiring line capacitance by a precharge circuit provided in an data controller unit 3b, to fix the data bus 15 to a certain potential, and change the potential of the data bus 15 according to data held in inverters.

Accordingly, issues can be circumvented that, when the data bus 15 is precharged from, for example, zero potential to a certain potential and the potential of the data bus 15 is discharged according to data held in inverters, the precharge requires a certain amount of time and energy.

<Modification>

Next, a transfer circuit and a nonvolatile semiconductor device using the transfer circuit, according to a modification of the embodiment will be described. In the modification, seven buffers BF are inserted into a data bus 15. Specifically, data latches 0DLe to 3DLe are divided into data latches 0DLe and 1DLe and data latches 2DLe and 3DLe, and data latches 0DLo to 3DLo are divided into data latches 0DLo and 1DLo and data latches 2DLo and 3DLo, and buffers BF are inserted between the data latches DL. Note that data latches 4DLe to 7DLe and 4DLo to 7DLo also have the same configuration, and thus, description thereof is omitted. Note also that in the modification the above-described data latch circuit 3b-1 is described as a data latch circuit 3b-1'.

<Configuration of the Data Latch Circuit 3b-1'>

Figure 20:
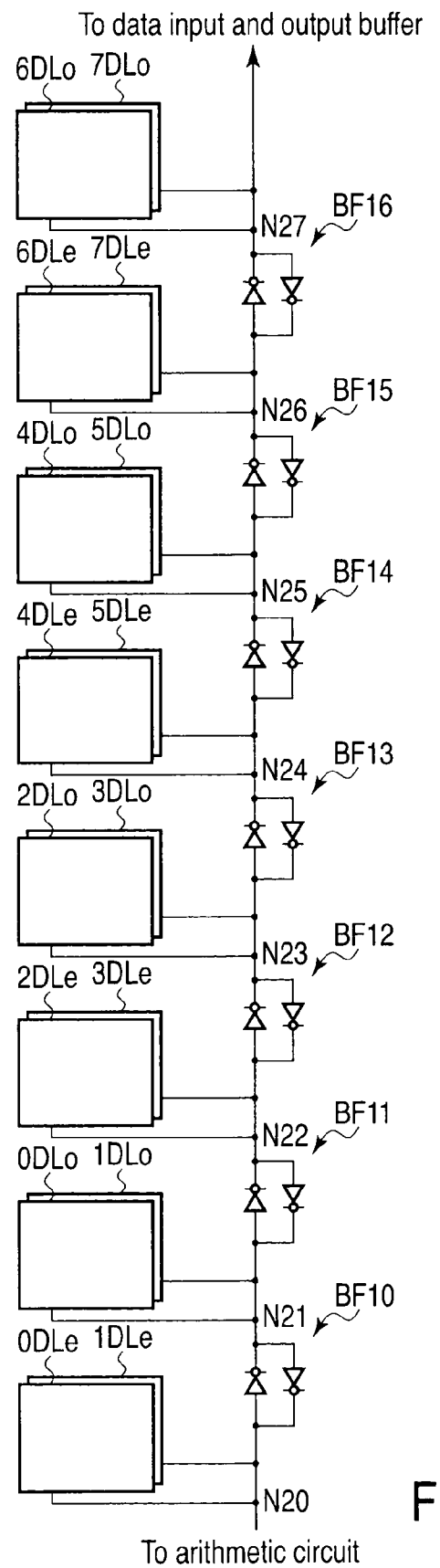
FIG. 20 is a block diagram of a data latch circuit according to a modification of the embodiment.

The data latch circuit 3b-1' according to the modification is shown in FIG. 20. FIG. 20 is a block diagram of the data latch circuit 3b-1' according to the modification. In the following description, only those configurations differing from those of the data latch circuit 3b-1 in the above-described embodiment will be described. As shown in the drawing, a buffer BF10 is provided between data latches 0DLe and 1DLe and 0DLo and 1DLo connected to the data bus 15. A buffer BF11 is provided between data latches 2DLe and 3DLe and 0DLo and 1DLo connected to the data bus 15. A buffer BF12 is provided between data latches 2DLe and 3DLe and 2DLo and 3DLo connected to the data bus 15. A buffer BF13 is provided between data latches 4DLe and 5DLe and 2DLo and 3DLo connected to the data bus 15. A buffer BF14 is provided between data latches 4DLe and 5DLe and 4DLo and 5DLo connected to the data bus 15. A buffer BF15 is provided between data latches 6DLe and 7DLe and 4DLo and 5DLo connected to the data bus 15. A buffer BF16 is provided between data latches 6DLe and 7DLe and 6DLo and 7DLo connected to the data bus 15. That is, wiring lines B in data latches 0DLe to 7DLe are connected to the data bus 15, and wiring lines A in data latches 0DLo to 7DLo are connected to the data bus 15.

<Write Operations (from a Host to the Data Latch Circuit 3b-1')>

Next, write operations in the above-described configuration will be described. Note that the write operations are the same as those described in the embodiment and thus will be briefly described.

When data is transferred from a host to data latches 0DLe and 1DLe, switching elements included in data latches 0DLe and 1DLe are turned on state, and buffers BF10 to BF16 are turned on state.

When data is transferred from the host to data latches 0DLo and 1DLo, switching elements included in data latches 0DLo and 1DLo are turned on state, and buffers BF11 to BF16 are turned on state and buffer BF10 is turned off state.

When data is transferred from the host to data latches 2DLe and 3DLe, switching elements included in data latches 2DLe and 3DLe are turned on state, and buffers BF12 to BF16 are turned on state and buffers BF10 and BF11 are turned off state.

When data is transferred from the host to data latches 2DLo and 3DLo, switching elements included in data latches 2DLo and 3DLo are turned on state, and buffers BF13 to BF16 are turned on state and buffers BF10 to BF12 are turned off state.

When data is transferred from the host to data latches 4DLe and 5DLe, switching elements included in data latches 4DLe and 5DLe are turned on state, and buffers BF14 to BF16 are turned on state and buffers BF10 to BF13 are turned off state.

When data is transferred from the host to data latches 4DLo and 5DLo, switching elements included in data latches 4DLo and 5DLo are turned on state, and buffers BF15 and BF16 are turned on state and buffers BF10 to BF14 are turned off state.

When data is transferred from the host to data latches 6DLe and 7DLe, switching elements included in data latches 6DLe and 7DLe are turned on state, and buffer BF16 is turned on state and buffers BF10 to BF15 are turned off state.

Finally, when data is transferred from the host to data latches 6DLo and 7DLo, switching elements included in data latches 6DLo and 7DLo are turned on state, and buffers BF10 to BF16 are turned off state.

<Write Operations (from the Data Latch Circuit 3b-1' to an Arithmetic Circuit 3b-2)>

Next, operations performed when transferring data from the data latch circuit 3b-1' to an arithmetic circuit 3b-2 in the above-described configuration will be described. When data is transferred from data latches 0DLe and 1DLe to the arithmetic circuit 3b-2, the switching elements included in data latches 0DLe and 1DLe are turned on state, and buffers BF10 to BF16 are turned off state. That is, the wiring line capacitance of the data bus 15 as viewed from data latches 0DLe and 1DLe is 1/8 in size, compared with the case in which buffers BF10 to BF16 are turned on state. Therefore, the energy required to transfer data held in data latches 0DLe and 1DLe to the data bus 15 is 1/8.

When data is transferred from data latches 0DLo and 1DLo to the arithmetic circuit 3b-2, the switching elements included in data latches 0DLo and 1DLo are turned on state, and buffers BF11 to BF16 are turned off state and buffer BF10 is turned on state. That is, the wiring line capacitance of the data bus 15 as viewed from data latches 0DLo and 1DLo is 2/8 in size, compared with the case in which buffers BF10 to BF16 are turned on state. Therefore, the energy required to transfer data held in data latches 0DLo and 1DLo to the data bus 15 is 2/8.

When data is transferred from data latches 2DLe and 3DLe to the arithmetic circuit 3b-2, the switching elements included in data latches 2DLe and 3DLe are turned on state, and buffers BF12 to BF16 are turned off state and buffers BF10 and BF11 are turned on state. That is, the wiring line capacitance of the data bus 15 as viewed from data latches 2DLe and 3DLe is 3/8 in size, compared with the case in which buffers BF10 to BF16 are turned on state. Therefore, the energy required to transfer data held in data latches 2DLe and 3DLe to the data bus 15 is 3/8.

When data is transferred from data latches 2DLo and 3DLo to the arithmetic circuit 3b-2, the switching elements included in data latches 2DLo and 3DLo are turned on state, and buffers BF13 to BF16 are turned off state and buffers BF10 to BF12 are turned on state. That is, the wiring line capacitance of the data bus 15 as viewed from data latches 2DLo and 3DLo is 4/8 (1/2) in size, compared with the case in which buffers BF10 to BF16 are turned on state. Therefore, the energy required to transfer data held in data latches 2DLo and 3DLo to the data bus 15 is 4/8.

When data is transferred from data latches 4DLe and 5DLe to the arithmetic circuit 3b-2, the switching elements included in data latches 4DLe and 5DLe are turned on state, and buffers BF14 to BF16 are turned off state and buffers BF10 to BF13 are turned on state. That is, the wiring line capacitance of the data bus 15 as viewed from data latches 4DLe and 5DLe is 5/8 in size, compared with the case in which buffers BF10 to BF16 are turned on state. Therefore, the energy required to transfer data held in data latches 4DLe and 5DLe to the data bus 15 is 5/8.

When data is transferred from data latches 4DLo and 5DLo to the arithmetic circuit 3b-2, the switching elements included in data latches 4DLo and 5DLo are turned on state, and buffers BF15 and BF16 are turned off state and buffers BF10 to BF14 are turned on state. That is, the wiring line capacitance of the data bus 15 as viewed from data latches 4DLo and 5DLo is 6/8 in size, compared with the case in which buffers BF10 to BF16 are turned on state. Therefore, the energy required to transfer data held in data latches 4DLo and 5DLo to the data bus 15 is 6/8.

When data is transferred from data latches 6DLe and 7DLe to the arithmetic circuit 3b-2, the switching elements included in data latches 6DLe and 7DLe are turned on state, and buffer BF16 is turned off state and buffers BF10 to BF15 are turned on state. That is, the wiring line capacitance of the data bus 15 as viewed from data latches 6DLe and 7DLe is 7/8 in size, compared with the case in which buffers BF10 to BF16 are turned on state. Therefore, the energy required to transfer data held in data latches 6DLe and 7DLe to the data bus 15 is 7/8.

Finally, when data is transferred from data latches 6DLo and 7DLo to the arithmetic circuit 3b-2, the switching elements included in data latches 6DLo and 7DLo are turned on state, and buffers BF10 to BF16 are turned on state. In this case, the wiring line capacitance as viewed from data latches 6DLo and 7DLo is the wiring line capacitance of the entire data bus 15.

<Read Operations (from the Arithmetic Circuit 3b-2 to the Data Latches DL)>

Next, read operations where data is transferred from the arithmetic circuit 3b-2 to the data latches DL in the above-described configuration will be described. When data is transferred from the arithmetic circuit 3b-2 to data latches 0DLe and 1DLe, the switching elements included in data latches 0DLe and 1DLe are turned on state, and buffers BF10 to BF16 are turned off state. That is, the wiring line capacitance of the data bus 15 as viewed from the arithmetic circuit 3b-2 is 1/8 in size, compared with the case in which buffers BF10 to BF16 are turned on state. Therefore, the energy required to transfer data held in the arithmetic circuit 3b-2 to the data bus 15 is 1/8.

When data is transferred from the arithmetic circuit 3b-2 to data latches 0DLo and 1DLo, the switching elements included in data latches 0DLo and 1DLo are turned on state, and buffers BF11 to BF16 are turned off state and buffer BF10 is turned on state. That is, the wiring line capacitance of the data bus 15 as viewed from the arithmetic circuit 3b-2 is 2/8 in size, compared with the case in which buffers BF10 to BF16 are turned on state. Therefore, the energy required to transfer data held in the arithmetic circuit 3b-2 to the data bus 15 is 2/8.

When data is transferred from the arithmetic circuit 3b-2 to data latches 2DLe and 3DLe, the switching elements included in data latches 2DLe and 3DLe are turned on state, and buffers BF12 to BF16 are turned off state and buffers BF10 and BF11 are turned on state. That is, the wiring line capacitance of the data bus 15 as viewed from the arithmetic circuit 3b-2 is 3/8 in size, compared with the case in which buffers BF10 to BF16 are turned on state. Therefore, the energy required to transfer data held in the arithmetic circuit 3b-2 to the data bus 15 is ⅜.

When data is transferred from the arithmetic circuit 3b-2 to data latches 2DLo and 3DLo, the switching elements included in data latches 2DLo and 3DLo are turned on state, and buffers BF13 to BF16 are turned off state and buffers BF10 to BF12 are turned on state. That is, the wiring line capacitance of the data bus 15 as viewed from the arithmetic circuit 3b-2 is 4/8 (½) in size, compared with the case in which buffers BF10 to BF16 are turned on state. Therefore, the energy required to transfer data held in the arithmetic circuit 3b-2 to the data bus 15 is 4/8.

When data is transferred from the arithmetic circuit 3b-2 to data latches 4DLe and 5DLe, the switching elements included in data latches 4DLe and 5DLe are turned on state, and buffers BF14 to BF16 are turned off state and buffers BF10 to BF13 are turned on state. That is, the wiring line capacitance of the data bus 15 as viewed from the arithmetic circuit 3b-2 is ⅝ in size, compared with the case in which buffers BF10 to BF16 are turned on state. Therefore, the energy required to transfer data held in the arithmetic circuit 3b-2 to the data bus 15 is ⅝.

When data is transferred from the arithmetic circuit 3b-2 to data latches 4DLo and 5DLo, the switching elements included in data latches 4DLo and 5DLo are turned on state, and buffers BF15 and BF16 are turned off state and buffers BF10 to BF14 are turned on state. That is, the wiring line capacitance of the data bus 15 as viewed from the arithmetic circuit 3b-2 is 6/8 in size, compared with the case in which buffers BF10 to BF16 are turned on state. Therefore, the energy required to transfer data held in the arithmetic circuit 3b-2 to the data bus 15 is 6/8.

When data is transferred from the arithmetic circuit 3b-2 to data latches 6DLe and 7DLe, the switching elements included in data latches 6DLe and 7DLe are turned on state, and buffer BF16 is turned off state and buffers BF10 to BF15 are turned on state. That is, the wiring line capacitance of the data bus 15 as viewed from the arithmetic circuit 3b-2 is ⅞ in size, compared with the case in which buffers BF10 to BF16 are turned on state. Therefore, the energy required to transfer data held in the arithmetic circuit 3b-2 to the data bus 15 is ⅞.

Finally, when data is transferred from the arithmetic circuit 3b-2 to data latches 6DLo and 7DLo, the switching elements included in data latches 6DLo and 7DLo are turned on state, and buffers BF10 to BF16 are turned on state. In this case, the wiring line capacitance as viewed from the arithmetic circuit 3b-2 is the wiring line capacitance of the entire data bus 15.

Even in a transfer circuit and a nonvolatile semiconductor device using the transfer circuit, according to the modification, energy consumption can be reduced in writing and reading. According to a data latch circuit 3b-1' according to the modification, the data latch circuit 3b-1' is further provided with buffers BF, the number of which is twice that in the above-described embodiment. The buffers BF have a switching function where the buffers BF are switched to either on or off state by a control signal generator 8. Therefore, as described above, when data is transferred from each data latch DL to an arithmetic circuit 3b-2 and when data is stored in each data latch DL from the arithmetic circuit 3b-2, the capacitance of a data bus 15 as viewed from each data latch DL is reduced. That is, energy consumption in writing and reading can be reduced. As with the above-described embodiment, energy consumption is quantitatively determined. The energy consumed by data latches 0DLe to 7DLe and 0DLo to 7DLo is:

$$\tfrac{1}{8}\times 2+\tfrac{2}{8}\times 2+\tfrac{3}{8}\times 2+\tfrac{4}{8}\times 2+\tfrac{5}{8}\times 2+\tfrac{6}{8}\times 2+\tfrac{7}{8}\times 2+\tfrac{8}{8}\times 2=9 \qquad (2).$$

It is assumed that the energy consumed when precharging the entire data bus 15 is 1, and 16 data transfers are performed. In this case, 16 units of energy are consumed. On the other hand, in the present modification, precharging the entire data bus 15 requires only 9 units of energy, and thus, the energy consumption can be reduced to, for example, 9/16.

Note that, although the data latches DL are divided into even ones (0DLe to 7DLe) and odd ones (0DLo to 7DLo), the configuration is not limited thereto as long as the configuration is such that a wiring line B and a wiring line A are alternately connected to the data bus 15 every insertion of a buffer BF.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A transfer circuit comprising:
a first inverter which is provided with a function of turning on or off state and which inverts, when on state, data at a first node and transfers the inverted data to a second node;
a second inverter which is provided with a function of turning on or off state and which inverts, when on state, the data at the second node and transfers the inverted data to the first node;
a first signal line connected to the first node;
a second signal line connected to the second node;
a first holding circuit which may output data to the first node and which may hold data at the first node; and
a second holding circuit which may output data to the second node and which may hold data at the second node,
wherein when the first holding circuit outputs the data to the first signal line through the first node, the first and second inverters are turned off state, and
when the second holding circuit outputs the data to the first signal line through the second node, the first inverter is turned off and the second inverter is turned on.
2. The circuit according to claim 1, wherein
the first holding circuit includes:
a first p-channel MOS transistor whose current path is connected at one end thereof to a third node to which an internal potential is supplied;
a second p-channel MOS transistor whose current path is connected at one end thereof to the other end of the current path of the first MOS transistor, and whose current path is connected at the other end thereof to the first node;
a third n-channel MOS transistor whose current path is connected at one end thereof to the first node; and
a fourth n-channel MOS transistor whose current path is connected at one end thereof to the other end of the current path of the third MOS transistor, and whose current path is grounded at the other end thereof,
wherein the first holding circuit may hold, as the data, first data or second data with a higher potential than the first data, when the first holding circuit holds the first data, the first and second p-channel MOS transistors are turned off, and the third and fourth n-channel MOS transistors are turned on, and when the first holding circuit holds the second data, the first and second p-channel MOS transistors are turned on, and the third and fourth n-channel MOS transistors are turned off.

3. The circuit according to claim 1, wherein
the first inverter includes:
a first p-channel MOS transistor whose current path is connected at one end thereof to a third node, and whose gate is connected to the first node;
a second p-channel MOS transistor whose current path is connected at one end thereof to the other end of the current path of the first MOS transistor, and whose current path is connected at the other end thereof to the second node;
a third n-channel MOS transistor whose current path is connected at one end thereof to the other end of the current path of the second MOS transistor through the second node; and
a fourth n-channel MOS transistor whose current path is connected at one end thereof to the other end of the current path of the third MOS transistor, and whose gate is connected to the first node, and whose current path is grounded at the other end thereof, and
the second inverter includes:
a fifth p-channel MOS transistor whose current path is connected at one end thereof to a fourth node, and whose gate is connected to the second node;
a sixth p-channel MOS transistor whose current path is connected at one end thereof to the other end of the current path of the fifth MOS transistor, and whose current path is connected at the other end thereof to the first node;
a seventh n-channel MOS transistor whose current path is connected at one end thereof to the other end of the current path of the sixth MOS transistor through the first node; and
an eighth n-channel MOS transistor whose current path is connected at one end thereof to the other end of the current path of the seventh MOS transistor, and whose gate is connected to the second node, and whose current path is grounded at the other end thereof.

4. A nonvolatile semiconductor device comprising:
a transfer circuit according to claim 1;
a memory cell array which includes memory cells which are allowed to hold the data, and each of which includes a charge accumulation layer and a control gate, current paths of the memory cells being connected in series;
a sense amplifier which writes the data to the memory cells;
an arithmetic circuit which performs an operation on the data held in the first holding circuit and the second holding circuit; and
a controller which controls on and off states of the first and second inverters,
wherein when the data held in the first holding circuit is transferred to the memory cells, the controller turns the first inverter and the second inverter off, and transfers a potential corresponding to the data held in the first holding circuit to the first signal line,
when the data held in the second holding circuit is transferred to the memory cells, the controller turns the first inverter off and turns the second inverter on, and transfers a potential corresponding to the data held in the second holding circuit to the first signal line through the second signal line, and
the data transferred by the first and second holding circuits to the arithmetic circuit through the first and second signal lines is transferred to the sense amplifier as write data.

5. The device according to claim 4, wherein
each of the first and second holding circuits in the transfer circuit includes a plurality of MOS transistors, and
the MOS transistors are formed in minimum processing dimensions.

6. The circuit according to claim 1, wherein
wiring lines of the first signal line and the second signal line are same in length, and
by turning the first and second inverters off, a capacitance of the wiring lines as viewed from the first holding circuit has a value half that obtained when the first inverter is turned on.

7. The circuit according to claim 1, wherein
each of the first and second holding circuits includes a plurality of MOS transistors, and
the MOS transistors are formed in minimum processing dimensions.

8. A transfer circuit comprising:
a first inverter which is provided with a function of turning on or off state and which inverts, when on state, data at a first node and transfers the inverted data to a second node;
a second inverter which is provided with a function of turning on or off state and which inverts, when on state, the data at the second node and transfers the inverted data to the first node;
a first signal line connected to the first node;
a second signal line connected to the second node;
a first holding circuit which may output data to the first node and which may hold data at the first node; and
a second holding circuit which may output data to the second node and which may hold data at the second node,
wherein when the first holding circuit captures the data on the first signal line, the first and second inverters are turned off state, and
when the second holding circuit captures the data on the second signal line, the first inverter is turned on state and the second inverter is turned off state.

9. The circuit according to claim 8, wherein
the first holding circuit includes:
a first p-channel MOS transistor whose current path is connected at one end thereof to a third node to which an internal potential is supplied;
a second p-channel MOS transistor whose current path is connected at one end thereof to the other end of the current path of the first MOS transistor, and whose current path is connected at the other end thereof to the first node;
a third n-channel MOS transistor whose current path is connected at one end thereof to the first node; and
a fourth n-channel MOS transistor whose current path is connected at one end thereof to the other end of the current path of the third MOS transistor, and whose current path is grounded at the other end thereof,
wherein the first holding circuit may hold, as the data, first data or second data with a higher potential than the first data,
when the first holding circuit holds the first data, the first and second p-channel MOS transistors are turned off state, and the third and fourth re-channel MOS transistors are turned on state, and when the first holding circuit holds the second data, the first and second p-channel MOS transistors are turned on state, and the third and fourth n-channel MOS transistors are turned off state.

10. The circuit according to claim 8, wherein
the first inverter includes:
a first p-channel MOS transistor whose current path is connected at one end thereof to a third node, and whose gate is connected to the first node;
a second p-channel MOS transistor whose current path is connected at one end thereof to the other end of the current path of the first MOS transistor, and whose current path is connected at the other end thereof to the second node;
a third n-channel MOS transistor whose current path is connected at one end thereof to the other end of the current path of the second MOS transistor through the second node; and
a fourth n-channel MOS transistor whose current path is connected at one end thereof to the other end of the current path of the third MOS transistor, and whose gate is connected to the first node, and whose current path is grounded at the other end thereof, and
the second inverter includes:
a fifth p-channel MOS transistor whose current path is connected at one end thereof to a fourth node, and whose gate is connected to the second node;
a sixth p-channel MOS transistor whose current path is connected at one end thereof to the other end of the current path of the fifth MOS transistor, and whose current path is connected at the other end thereof to the first node;
a seventh n-channel MOS transistor whose current path is connected at one end thereof to the other end of the current path of the sixth MOS transistor through the first node; and
an eighth n-channel MOS transistor whose current path is connected at one end thereof to the other end of the current path of the seventh MOS transistor, and whose gate is connected to the second node, and whose current path is grounded at the other end thereof.

11. A nonvolatile semiconductor device comprising:
a transfer circuit according to claim 8;
a memory cell array which includes a plurality of memory cells which are allowed to hold the data, and each of which includes a charge accumulation layer and a control gate, current paths of the memory cells being connected in series;
a sense amplifier which reads the data from the memory cells;
an arithmetic circuit which performs an operation on the data held in the sense amplifier; and
a controller which controls on and off states of the first and second inverters,
wherein when the data read from the memory cells is transferred from the arithmetic circuit to the first holding circuit, the controller turns the first inverter and the second inverter off state, and inverts the data held in the arithmetic circuit and transfers the inverted data to the first holding circuit, and
when the data is transferred from the arithmetic circuit to the second holding circuit, the controller turns the first inverter on state and turns the second inverter off state, and transfers the data held in the arithmetic circuit to the second holding circuit.

12. The device according to claim 11, wherein
each of the first and second holding circuits in the transfer circuit includes a plurality of MOS transistors, and
the MOS transistors are formed in minimum processing dimensions.

13. The circuit according to claim 8, wherein
wiring lines of the first signal line and the second signal line are same in length, and
by turning the first and second inverters off state, a capacitance of the wiring lines as viewed from the first holding circuit has a value half that obtained when the first inverter is turned on state.

14. The circuit according to claim 8, wherein
each of the first and second holding circuits includes a plurality of MOS transistors, and
the MOS transistors are formed in minimum processing dimensions.

15. A transfer method of a transfer circuit, comprising:
turning a first inverter and a second inverter off state, the first inverter inverting data on a first signal line and outputting the inverted data to a second signal line, and the second inverter inverting data on the second signal line and outputting the inverted data to the first signal line;
outputting data to the first signal line from a first holding circuit which may hold data on the first signal line;
closing a switch in the first holding circuit to stop outputting the data to the first signal line; and
turning the second inverter on state and turning the first inverter off state, and outputting data to the second signal line from a second holding circuit which may hold data on the second signal line.

16. The method of a circuit according to claim 15, wherein
wiring lines of the first signal line and the second signal line are same in length, and
by turning the first and second inverters off state, a capacitance of the wiring lines as viewed from the first holding circuit has a value half that obtained when the first inverter is turned on state.

17. The method of a circuit according to claim 15, wherein
each of the first and second holding circuits includes a plurality of MOS transistors, and
the MOS transistors are formed in minimum processing dimensions.

18. The method of a circuit according to claim 15, further comprising:
turning the first inverter and the second inverter off state;
turning the switch in the first holding circuit on state and transferring the data on the first signal line to the first holding circuit; and
turning the switch and the second inverter off state and turning the first inverter on state, and transferring the data on the second signal line to the second holding circuit.

19. The method of a circuit according to claim 18, wherein
wiring lines of the first signal line and the second signal line are same in length, and
by turning the first and second inverters off state, a capacitance of the wiring lines as viewed from the first holding circuit has a value half that obtained when the first inverter is turned on state.

* * * * *